(12) United States Patent
Chen

(10) Patent No.: US 8,643,149 B2
(45) Date of Patent: Feb. 4, 2014

(54) STRESS BARRIER STRUCTURES FOR SEMICONDUCTOR CHIPS

(75) Inventor: Ming-Fa Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 300 days.

(21) Appl. No.: 12/683,604

(22) Filed: Jan. 7, 2010

(65) Prior Publication Data

US 2010/0224966 A1    Sep. 9, 2010

Related U.S. Application Data

(60) Provisional application No. 61/157,122, filed on Mar. 3, 2009.

(51) Int. Cl.
*H01L 23/48* (2006.01)
*H01L 23/498* (2006.01)

(52) U.S. Cl.
USPC ............ 257/621; 257/737; 257/E23.011; 257/E23.07

(58) Field of Classification Search
USPC ................................ 257/621, 737, E23.07
See application file for complete search history.

(56) References Cited

U.S. PATENT DOCUMENTS

| | | | |
|---|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |

(Continued)

*Primary Examiner* — Matthew W Such
*Assistant Examiner* — Monica D Harrison
(74) *Attorney, Agent, or Firm* — Slater & Matsil, L.L.P.

(57) ABSTRACT

Stress barrier structures for semiconductor chips, and methods of fabrication thereof are described. In one embodiment, the semiconductor device includes a semiconductor substrate that includes active circuitry and an interconnect metallization structure over the active circuitry, wherein the interconnect metallization structure includes a layer of low-k insulating layer. A first metal bump is disposed over the semiconductor substrate and coupled to the active circuitry of the semiconductor substrate. A first stress barrier structure is disposed under the metal bump, and disposed over the low-k insulating layer, and a second substrate is disposed over the first metal bump.

18 Claims, 18 Drawing Sheets

(56) References Cited

U.S. PATENT DOCUMENTS

| | | |
|---|---|---|
| 7,193,308 B2 | 3/2007 | Matsui |
| 7,262,495 B2 | 8/2007 | Chen et al. |
| 7,297,754 B2 | 11/2007 | Thomas et al. |
| 7,335,972 B2 | 2/2008 | Chanchani |
| 7,355,273 B2 | 4/2008 | Jackson et al. |
| 7,364,998 B2 * | 4/2008 | Chiu et al. .................... 438/597 |
| 7,407,833 B2 * | 8/2008 | Wu ................................ 438/108 |
| 7,833,894 B2 * | 11/2010 | Hiatt ............................. 438/598 |
| 2003/0025202 A1 * | 2/2003 | Mikagi et al. ................. 257/737 |
| 2008/0006945 A1 * | 1/2008 | Lin et al. ....................... 257/758 |

* cited by examiner

STRESS BARRIER STRUCTURES FOR SEMICONDUCTOR CHIPS

This application claims the benefit of U.S. Provisional Application No. 61/157,122, entitled "Stress Barrier Structures for Semiconductor Chips," filed on Mar. 3, 2009, which is incorporated herein by reference.

TECHNICAL FIELD

The present invention relates generally to semiconductor chips, and more particularly to stress barrier structures for semiconductor chips and methods of fabrication thereof.

BACKGROUND

Semiconductor devices are manufactured by forming active regions in a semiconductor substrate, depositing various insulating, conductive, and semiconductive layers over the substrate, and patterning them in sequential steps. The upper or last-formed layers of the semiconductor device typically comprise metallization layers. The metallization layers typically comprise one or more layers of metal interconnect having conductive lines disposed within an insulating material and may provide connections to underlying active regions and connections within and over the substrate. The metallization layers comprise low or ultra low dielectric constant materials as insulating material to minimize capacitive coupling between the conductive lines. However, low or ultra low dielectric constant materials have poor mechanical properties and are susceptible to failure, for example, due to delamination.

In conventional package configurations, an IC in the form of a die is secured to a printed circuit board (PCB). After curing, the die is electrically connected to the PCB and encapsulated with a mold compound to form a complete package. During fabrication, tremendous thermal mismatch occurs between all these structures generating intense mechanical stress. For example, low-k or ultra low-k dielectric layers within the metallization layers of the die may be compromised, and may delaminate resulting in chip failure. The presence of through substrate vias magnifies the problem due to an increase in stress around the through substrate vias.

Hence, what is needed in the art are improved structures and methods of forming chips without significantly impacting reliability.

SUMMARY OF THE INVENTION

These and other problems are generally solved or circumvented, and technical advantages are generally achieved, by preferred embodiments of the present invention.

Embodiments of the invention include stress barrier structures for semiconductor structures. In accordance with an embodiment of the present invention, a semiconductor substrate comprises active circuitry and an interconnect metallization structure over the active circuitry, wherein the interconnect metallization structure comprises a layer of low dielectric constant insulating layer. A metal bump is disposed over the semiconductor substrate and coupled to the active circuitry of the semiconductor substrate. A stress barrier structure is disposed under the metal bump, and disposed over the low dielectric constant insulating layer, and a substrate is disposed over the metal bump.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a and 1b, illustrates a packaged chip in accordance with an embodiment of the invention, wherein FIG. 1a illustrates a cross sectional view, and wherein FIG. 1b illustrates a top view;

FIG. 2, which includes FIGS. 2a-2c, illustrates a chip in accordance with embodiments of the invention, wherein FIG. 2a illustrates an embodiment wherein the stress barrier structure is disposed along with redistribution lines, wherein FIG. 2b illustrates an embodiment wherein the stress barrier structure is disposed in an additional layer disposed between redistribution lines and the bump contacts, and wherein FIG. 2c illustrates an embodiment wherein the stress barrier structure is disposed within the passivation layer of the chip;

FIG. 3, which includes

FIG. 4, which includes FIGS. 4a and 4b, illustrates a chip in accordance with embodiments of the invention, wherein FIG. 4a illustrates a cross sectional view of the chip, and wherein FIG. 4b illustrates a top view;

FIG. 5, which includes

FIG. 6, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
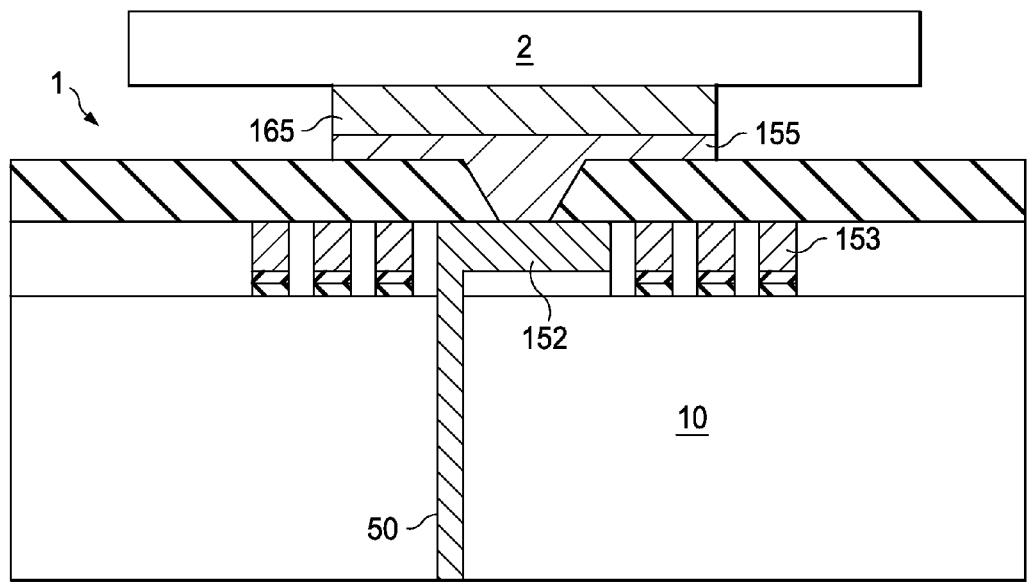

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely to stress barrier structure to minimize stress in low-k layers within a semiconductor chip. The invention may also be applied, however, to minimize stress in other layers or devices.

Semiconductor dies are mounted on a substrate forming a packaged chip. A source of stress between the die and the mounting substrate (e.g. printed circuit board) is the thermal mismatch between them. The coefficient of thermal expansion of the die is typically much lower than the thermal coefficient of thermal expansion of the circuit board. Significant thermal mismatch stresses arise between them when the system is thermally cycled over a temperature range due to operation or in fabrication. Further, an increase in temperature enhances failure modes by providing the energy required for the failure mechanisms.

This thermal mismatch results in a shear strain in the contact connections every time the die/substrate assembly heats up and cools down. In particular, the connections located at the corners of the die have the highest amount of shear strain, because they are the farthest from the neutral point at the center of the die and must absorb the largest displacement force during thermal cycling.

A typical prior art means of connecting the die contacts to the substrate contacts is to use solder. The solder is applied in a ball or columnar shape when hot and in a liquid state, and allowed to cool and solidify into a rigid permanent connection. However, since solder connections are rigid and cannot move in response to thermal mismatch shear strains, multiple heating and cooling cycles can eventually cause failure of the solder connections or material layers underneath the solder connections. Further, through substrate vias used to stack multiple chips introduce large amounts of stress during and subsequent to processing. These high stress fields around through substrate vias and underneath the solder connections may initiate cracks that propagate through the metallization layers. In particular, high stress regions of low dielectric constant material layers are prone to crack nucleation. In various embodiments, the invention overcomes these problems by forming a stress barrier structure (e.g., a cobweb structure) that dissipates the stress (stress energy) uniformly over a larger region.

In various embodiments, the stress barrier structure is formed immediately underneath and around the high stress concentration areas. It comprises a rigid material to efficiently transfer the stress. In various embodiments, the stress barrier structure transfers or dissipates the stress energy over a larger volume, thus reducing the peak stress values. For example, in one embodiment, a peak stress of about 100 MPa over a 1 nm$^3$ may be dissipated as a peak stress of about 10 MPa over a 100 nm$^3$, thus dramatically reducing the propensity to cause defect and/or crack nucleation.

A structural embodiment of the invention will be described in FIG. 1. Further structural embodiments will be described in FIGS. 2-5. A structural embodiment of a stacked integrated chip will be described in FIG. 7. A method of fabrication of the semiconductor device will be described in FIG. 6.

Figure 1B:
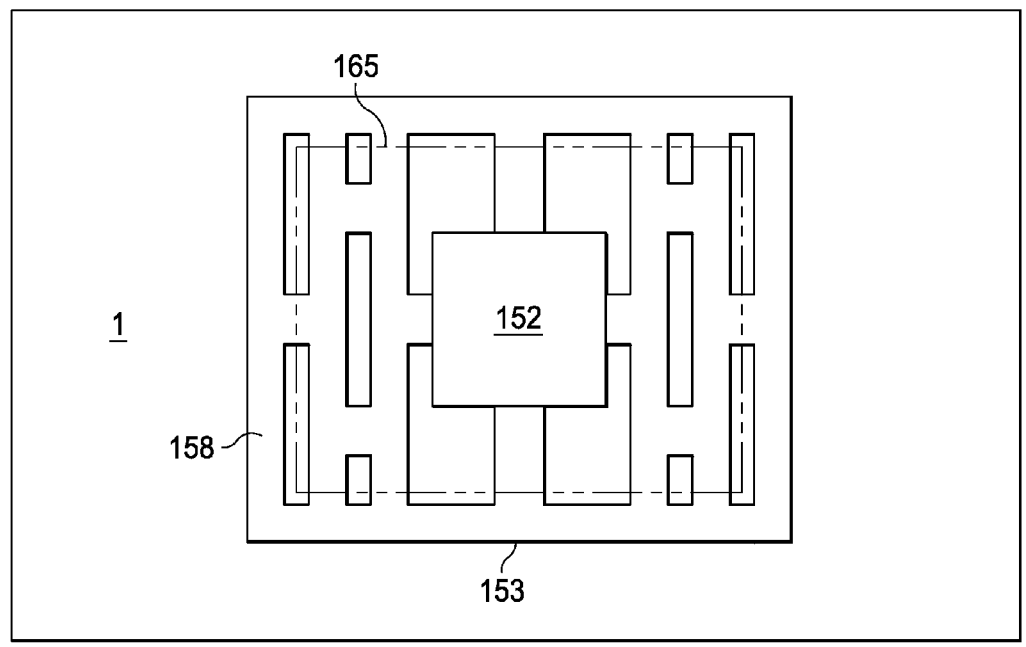

FIG. 1, which includes FIGS. 1a and 1b, illustrates a packaged chip in accordance with an embodiment of the invention, wherein FIG. 1a illustrates a cross sectional view, and wherein FIG. 1b illustrates a top view.

Referring to FIG. 1, a chip 1 including a first substrate 10 is attached to a second substrate 2. In various embodiments, the first substrate 10 is a semiconductor, whereas the second substrate 2 comprises a PCB substrate. The chip 1 is coupled to the second substrate 2 through a bump 165. The bump 165 is coupled to the circuitry of the chip 1. In various embodiments, the bump 165 comprises a copper bump, a lead free bump or a Sn—Ag bump. In one embodiment, the bump 165 is coupled to a through substrate via 50 disposed within the first substrate 10.

As illustrated in FIG. 1a, a stress barrier structure 153 is disposed within a top layer of the chip 1. The stress barrier structure 153 comprises a metallic network (e.g. interconnected metal lines) and comprises copper or aluminum in one embodiment. In one embodiment, the stress barrier structure 153 comprises a cobweb structure. The stress barrier structure 153 is disposed under the bump 165, and may be electrically connected to the active circuitry of the chip 1. In various embodiments, the stress barrier structure 153 is formed in a top insulating layer disposed above the low dielectric constant (low-k) dielectric insulating layers or extreme low-k dielectric insulating layers of the chip 1.

Low-k materials have a dielectric constant less than silicon dioxide, and hence have a dielectric constant less than 3.9. Ultra or extreme low-k dielectric materials have a much lower dielectric constant, for example, less than 3.0. In one embodiment, the stress barrier structure 153 is formed above the passivation layer of the chip 1, for example, in a redistribution metal line layer 152. In another embodiment, the stress barrier structure 153 is disposed within the top metal level of the chip 1. In one embodiment, the stress barrier structure 153 may be formed as an additional metal level, for example, within the passivation layer of the chip 1.

FIG. 1b illustrates a top view of the stress barrier structure 153. As illustrated in FIG. 1b, the stress barrier structure 153 comprises interconnected metal lines 158. Also shown in FIG. 1b is the top view of the bump 165 (dashed line) above the stress barrier structure 153. In various embodiments, the stress barrier structure 153 may be interconnected to electrical circuitry within the chip 1. In the illustrated embodiment, the stress barrier structure 153 is formed in a same level as the redistribution metal line layer 152.

The stress barrier structure 153 provides a buffer layer and blocks the transmission of stress from the bump 165 into the chip 1. In particular, the stress barrier structure 153 translates some of the vertical stress into horizontal components. The lower vertical stress prevents damage to the underlying low-k or extreme low-k dielectric material layers. Further, as the stress barrier structure 153 comprises a rigid material, the strain from the bump 165 is accommodated over a larger volume. For example, the strain from the bump 165 is dissipated across a larger area around the stress barrier structure 153. In various embodiments, the stress barrier structure 153 is formed also around the through substrate vias 50, thus mitigating the higher stress fields around the through substrate via 50.

Figure 2A:
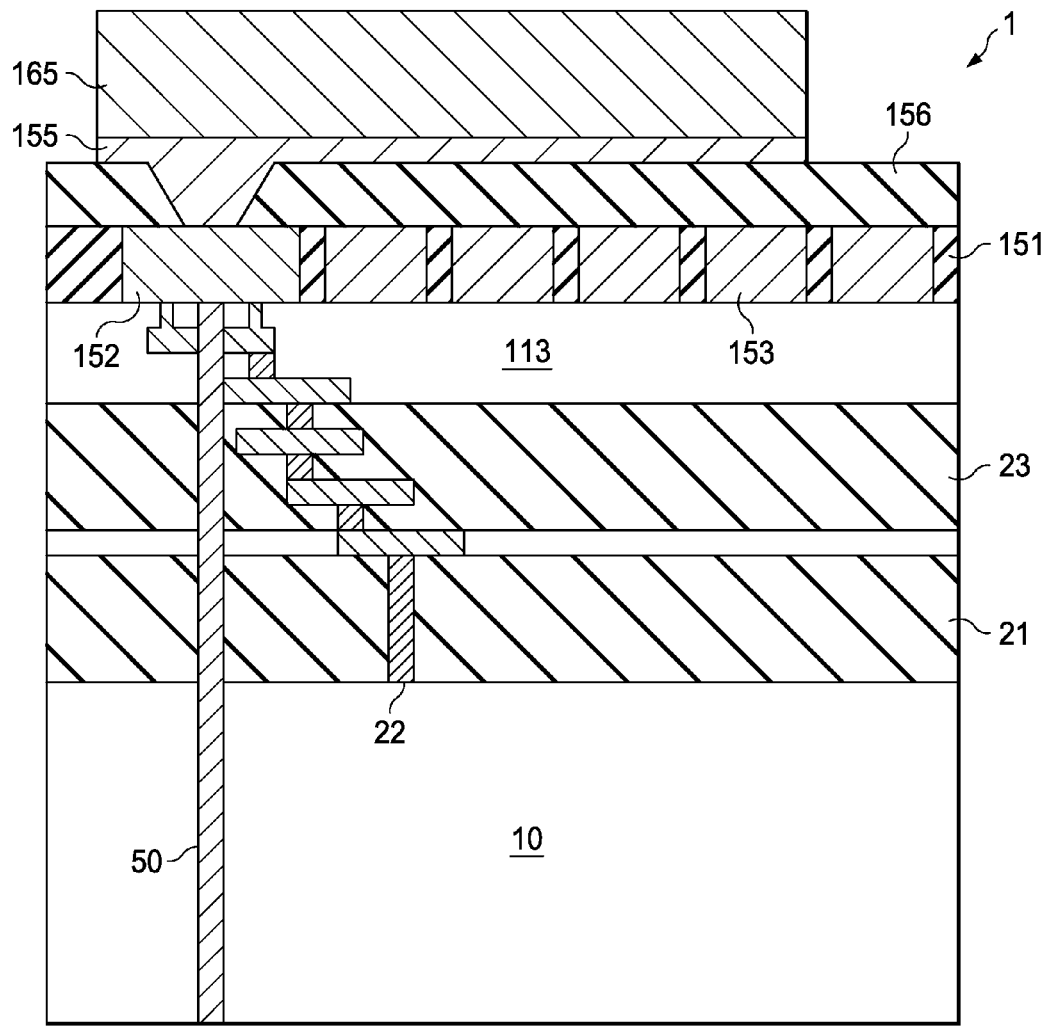
Figure 2B:
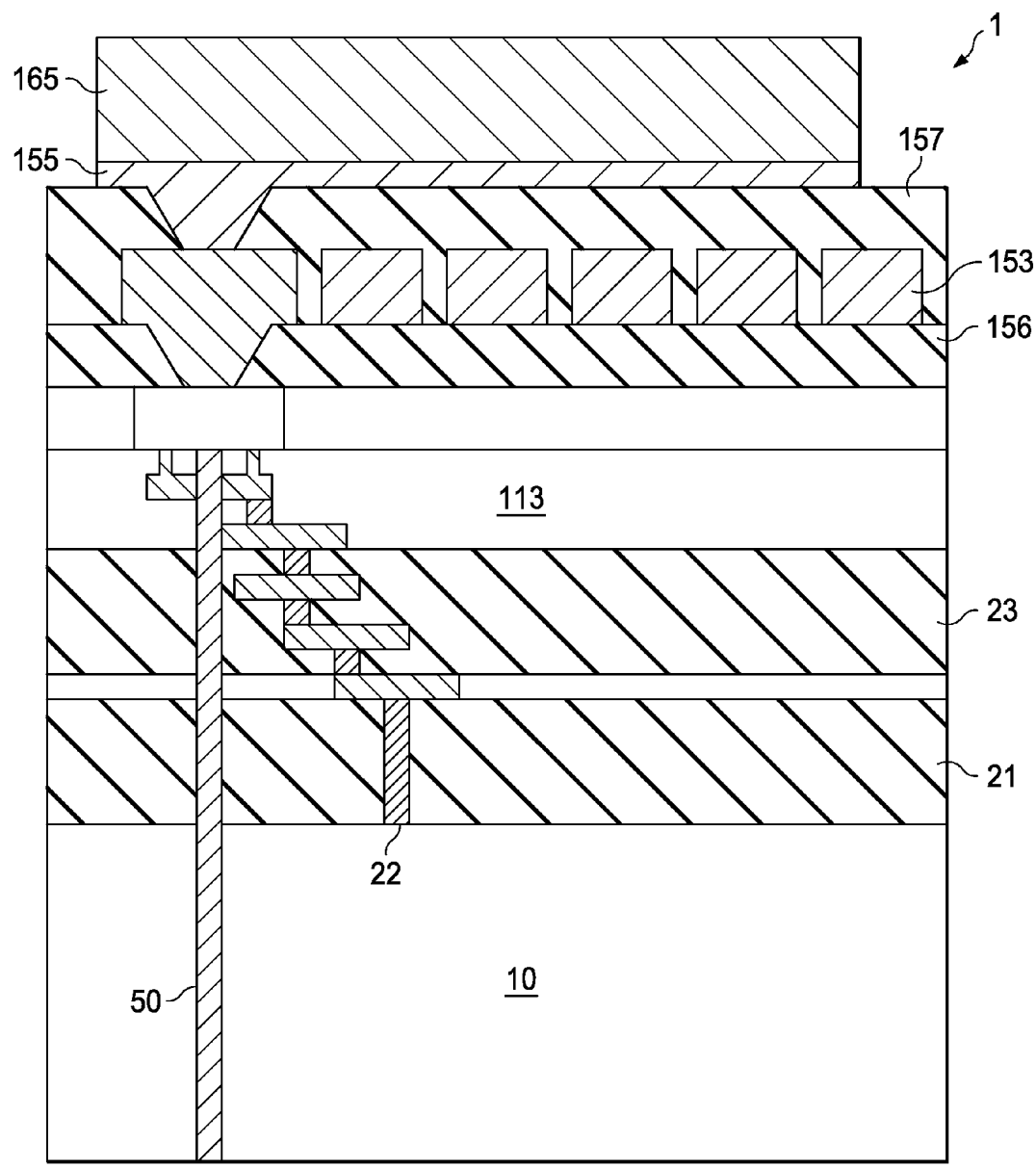
Figure 2C:
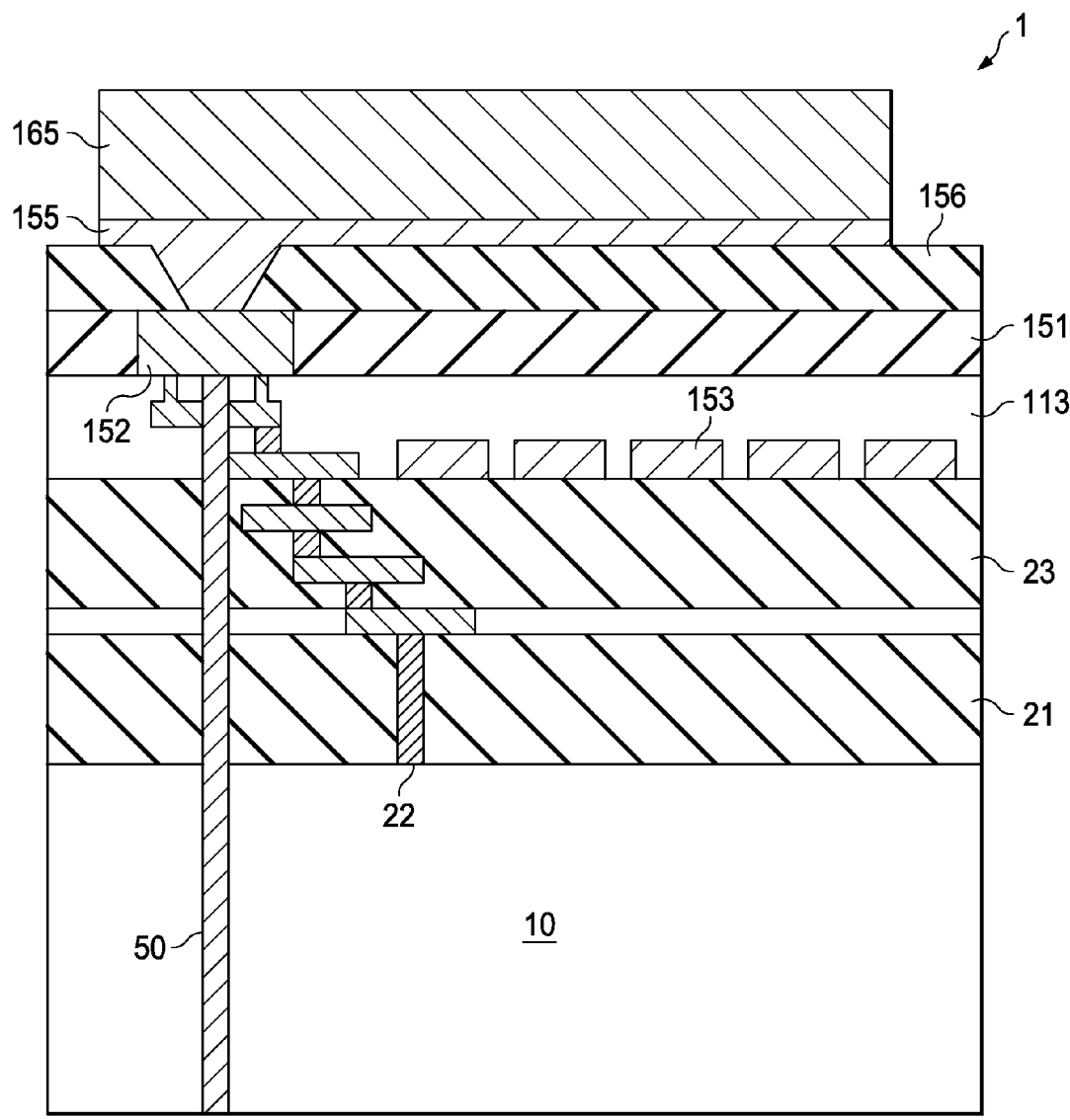

FIG. 2, which includes FIGS. 2a-2c, illustrates a chip 1 in accordance with embodiments of the invention, wherein FIG. 2a illustrates an embodiment wherein the stress barrier structure is disposed along with redistribution lines, wherein FIG. 2b illustrates an embodiment wherein the stress barrier structure is disposed in an additional layer disposed between redistribution lines and the bump contacts, and wherein FIG. 2c illustrates an embodiment wherein the stress barrier structure is disposed within the passivation layer of the chip.

Referring to FIG. 2a, the chip 1 comprises a substrate 10 comprising active circuitry. The active devices are coupled to metallization layers. The first metallization layer formed within a first insulating layer 21 comprises contacts 22. Subsequent metallization levels are formed within low-k insulating layers 23. A through substrate via 50 is disposed within the substrate and coupled to the active circuitry through the low-k insulating layers 23 and the first insulating layer 21. A passivation layer 113 is disposed over the low-k insulating layer 23. A redistribution metal line layer 152 comprising redistribution lines is disposed over the passivation layer 113. An under bump metal structure 155 is disposed over the redistribution metal lines 152 through a first polyimide material layer 156. A bump 165 is disposed over the under bump metal structure 155. In various embodiments, the chip 1 comprises a stress barrier structure 153 disposed above the passivation layer 113 and in the same level as the redistribution metal line layer 152. In various embodiments, the stress barrier structure 153 minimizes the transfer of stress from the contacts (bumps 165 contacting a second substrate) to the underlying low-k dielectric layers 23. In one embodiment, the stress barrier structure 153 comprises a cobweb structure.

FIG. 2b illustrates an alternative embodiment wherein a stress barrier structure 153 is disposed as a separate layer, for example, between a first polyimide material layer 156 and a second polyimide material layer 157. FIG. 2c illustrates an alternative embodiment wherein the stress barrier structure 153 is disposed within the passivation layer 113.

Figure 3A:
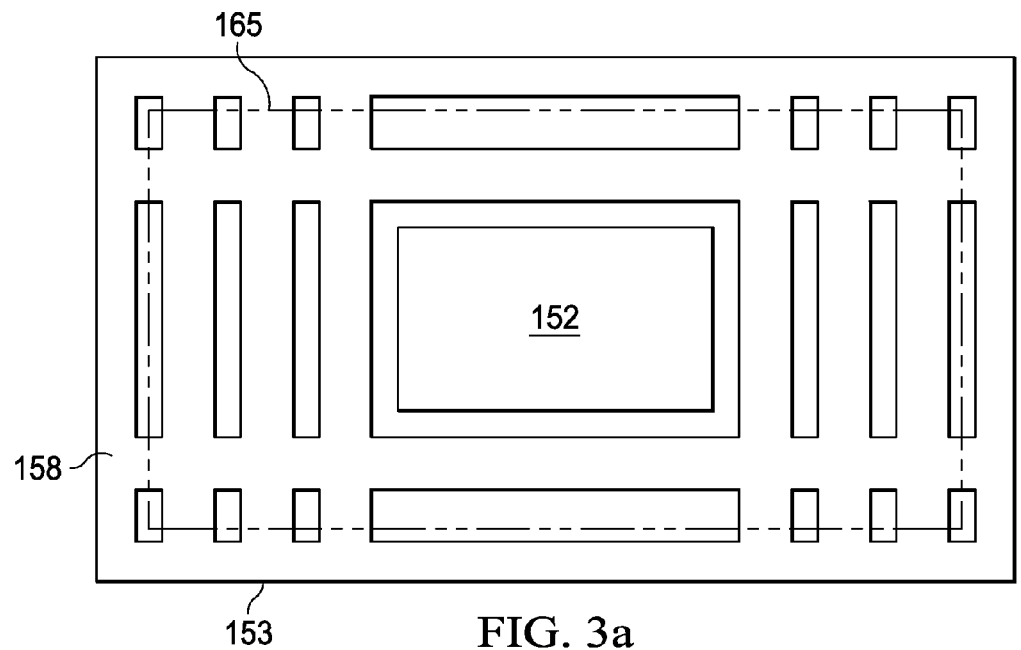
FIGS. 3a-3c, illustrates various patterns of the stress barrier structure in accordance with embodiments of the invention.
Figure 3B:
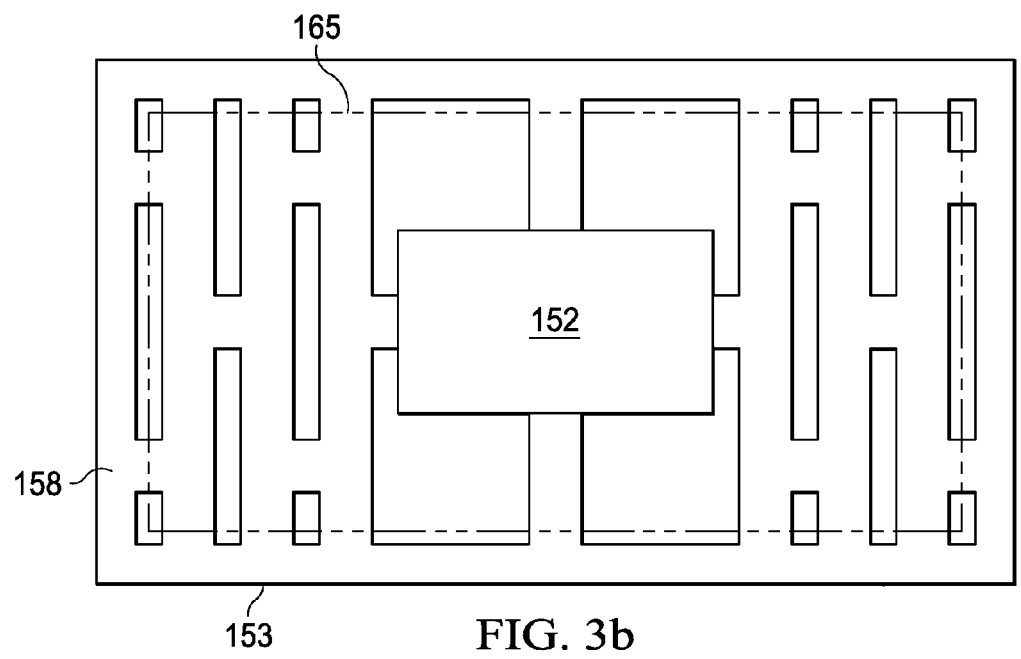
Figure 3C:
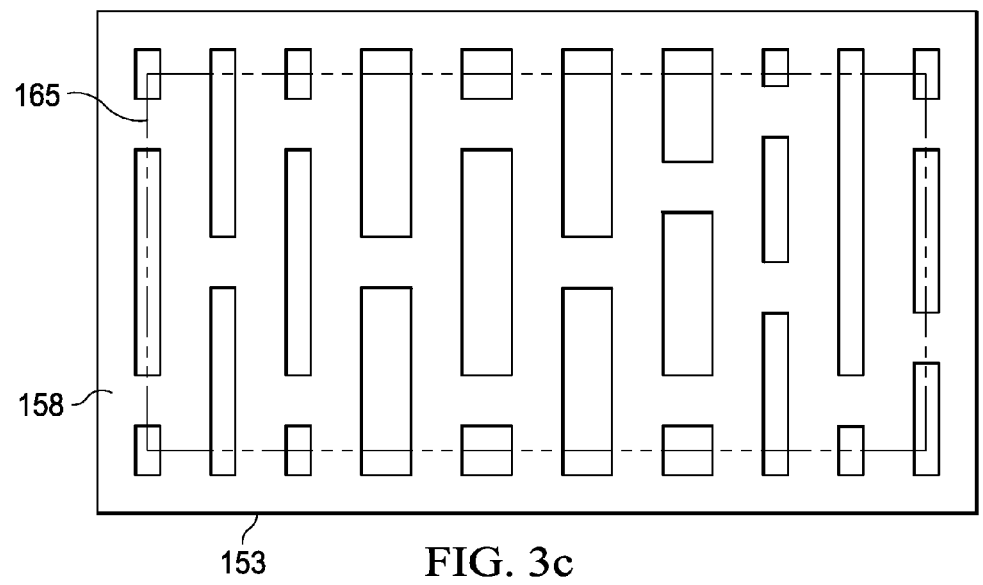

FIG. 3, which includes FIGS. 3a-3c, illustrates various patterns of the stress barrier structure in accordance with embodiments of the invention. In various embodiments, the stress barrier structure comprises a suitable shape that minimizes the transfer of stress from the contacts (metal bumps contacting a substrate) to the underlying low-k dielectric or ultra low-k dielectric material layers. The bumps 165 are shown as dashed lines in FIG. 3.

Referring to FIG. 3a, the stress barrier structure 153 comprises interlinked metal lines 158. In this embodiment, the interlinked metal lines 158 are not coupled to the bump 165 disposed above. Alternatively, in another embodiment (FIG. 3b), the stress barrier structure 153 is coupled to the bump 165. The stress barrier structure 153 may comprise any suitable pattern of interlinked metal lines, while in FIG. 3c, only horizontal and vertical lines are illustrated. In different embodiments, each metal line of the interlinked metal lines 158 may be at a different angle, for example, forming patterns of triangular or hexagonal shape.

Figure 4A:
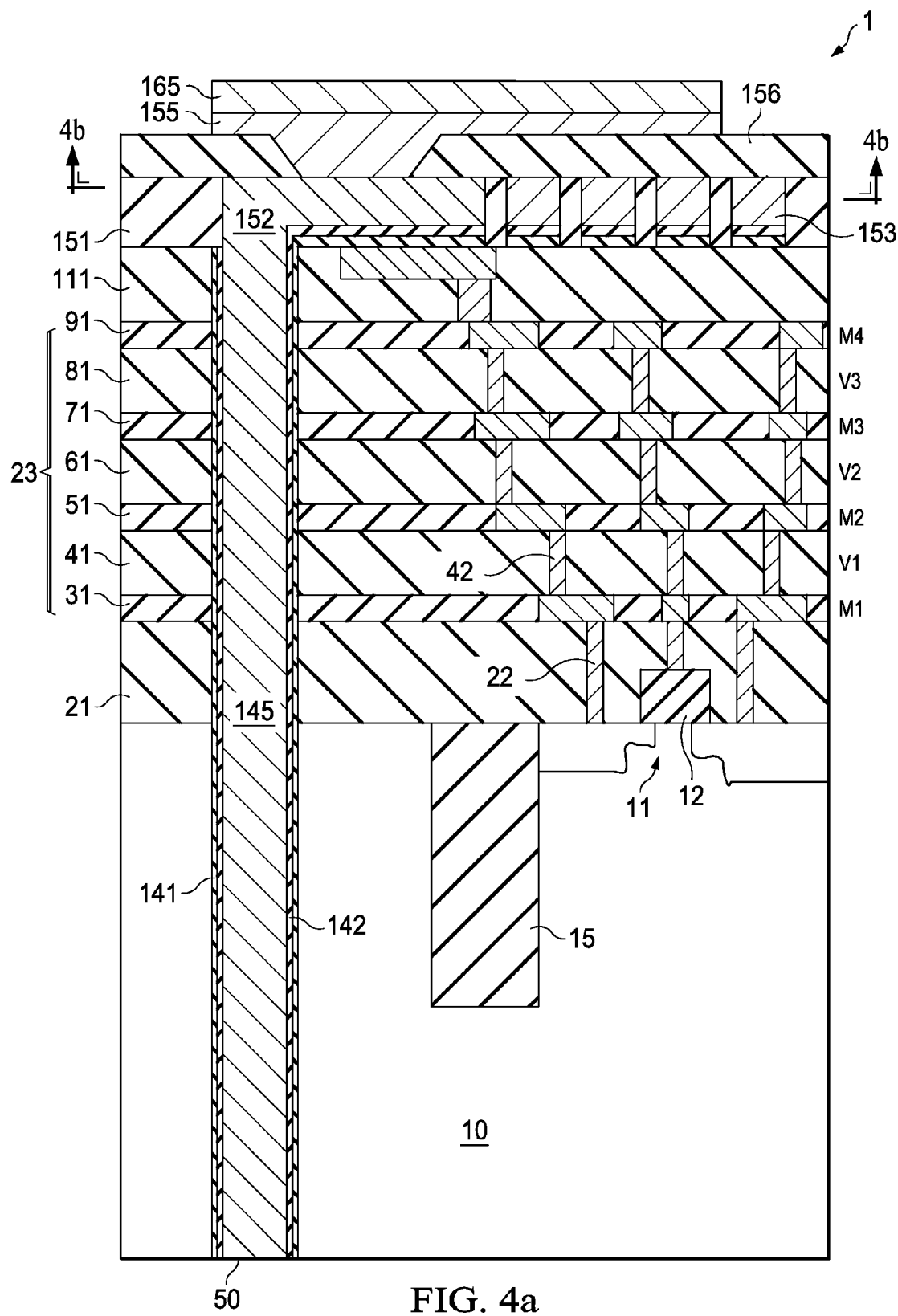
Figure 4B:
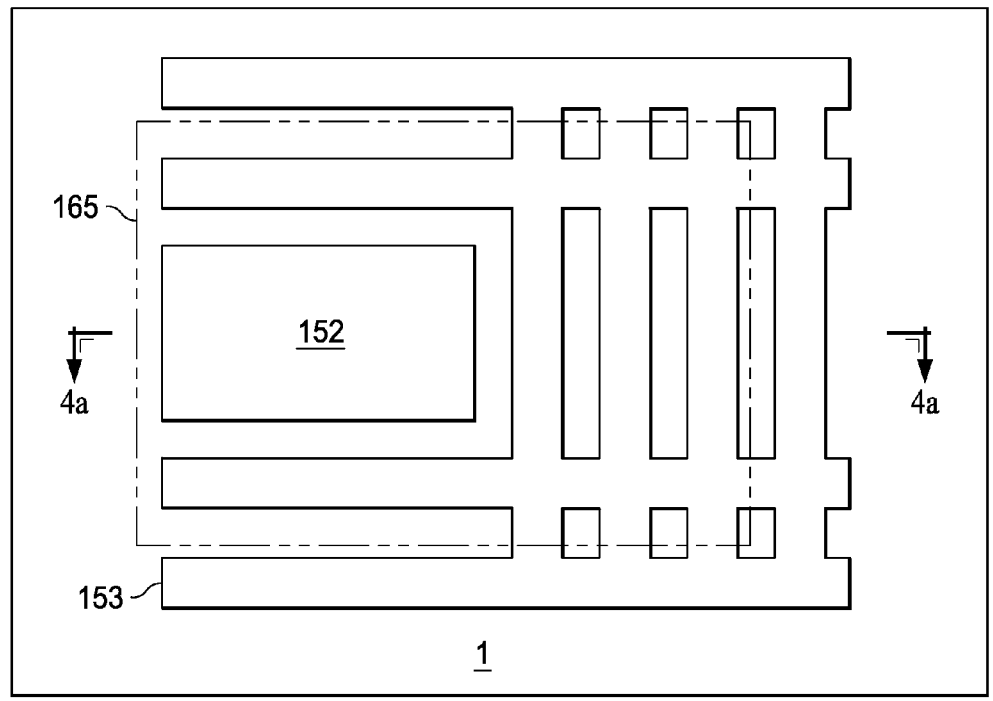

FIG. 4, which includes FIGS. 4a and 4b, illustrates a chip 1 in accordance with embodiments of the invention, wherein FIG. 4a illustrates a cross sectional view of the chip 1, and wherein FIG. 4b illustrates a top view.

Referring to FIG. 4a, active device regions 11 are disposed on a top surface of the substrate 10 separated by isolation regions 15. Metallization layers are disposed over the active device regions 11 and may comprise many metallization levels. The active device regions 11 are contacted through contacts 22 disposed within a first insulating layer 21. In the illustrated embodiment, only as an example, five metal levels are illustrated. Each metal or via level comprises metal lines or vias disposed in an insulating layer.

Low-k insulating layers 23 are disposed over the first insulating material layer 21. The low-k insulating layers 23 comprise a number of insulating layers. For example, in one embodiment, the low-k insulating layers 23 comprise second, third, fourth, fifth, sixth, seventh, and eighth insulating material layers 31, 41, 51, 61, 71, 81, and 91. The metallization formed in the low-k insulating layers 23 thus comprises first metal line level (M1), first via level (V1), second metal line level (M2), second via level (V2), third metal line level (M3), third via level (V3), and fourth metal line level (M4). The metallization is covered by a thick ninth insulating layer 111 (passivation layer). A through substrate via 50 is disposed within the substrate 10 and coupled to the bump 165 through a redistribution metal line layer 152. The redistribution metal line layer 152 is formed within a tenth insulating layer 151. A stress barrier structure 153 is disposed under the bump 165. In one embodiment, the stress barrier structure 153 comprises a cobweb structure.

FIG. 4b is a top view of the chip 1 and illustrates a stress barrier structure 153 disposed under the bump 165. The stress barrier structure 153 is hence disposed around the metal lines of a redistribution metal line layer 152.

Figure 5C:
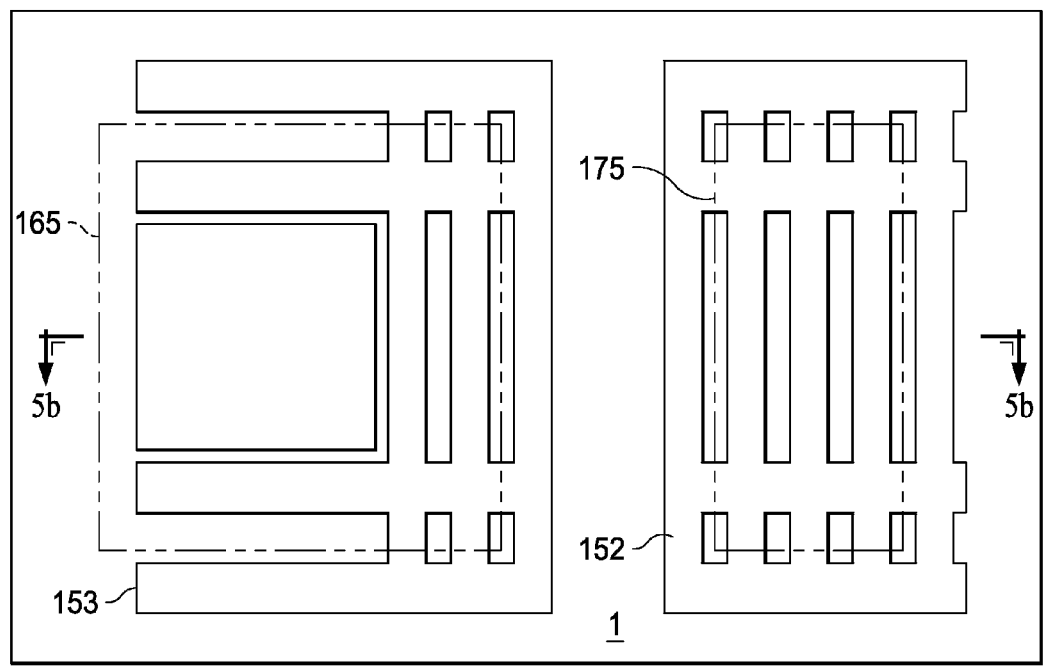
FIGS. 5a-5c, illustrates a chip comprising dummy metal bumps and additional stress barrier structures underneath the dummy metal bumps, in accordance with an embodiment of the invention.
Figure 5A:
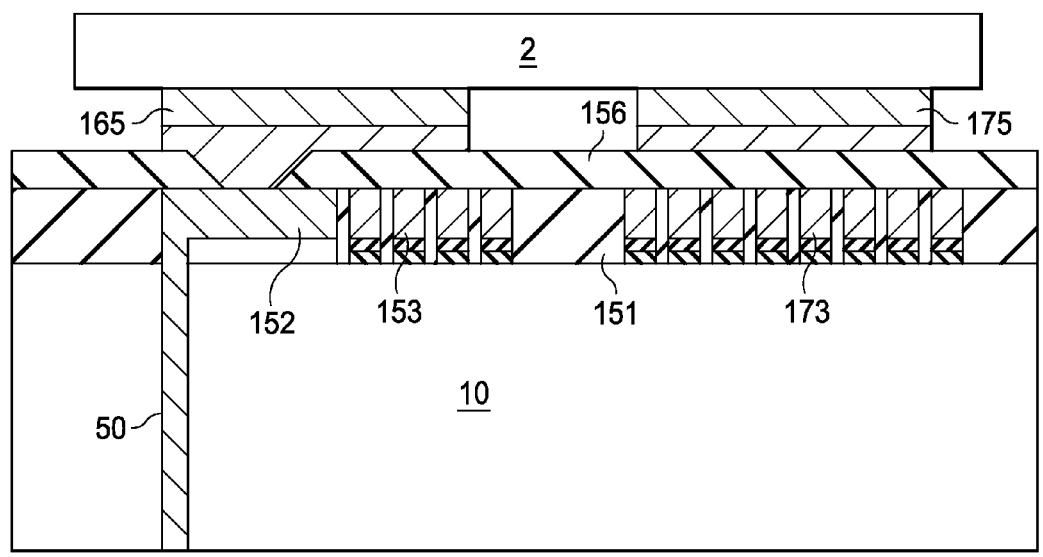
Figure 5B:
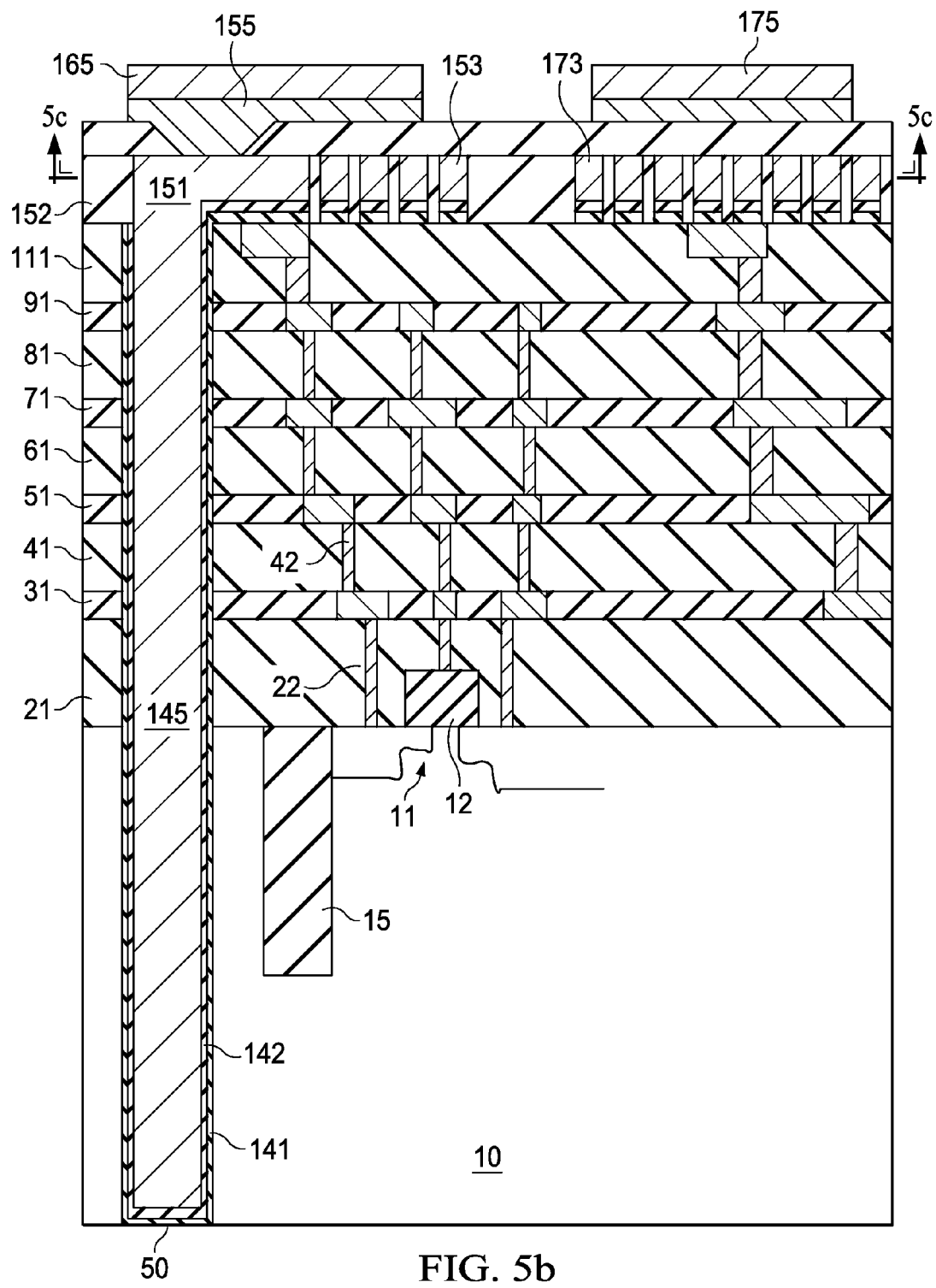

FIG. 5, which includes FIGS. 5a-5c, illustrates a chip comprising dummy metal bump and additional stress barrier structures underneath the dummy metal bumps, in accordance with an embodiment of the invention. FIG. 5b illustrates a cross sectional view of a portion of the chip 1 illustrated in FIG. 5a, and FIG. 5c illustrates a top view.

FIG. 5 illustrates a chip 1 mounted on a second substrate 2. As in prior embodiments, the chip 1 is coupled to the second substrate 2 through a bump 165. The bump 165 is coupled to the circuitry of the chip 1. In one embodiment, the bump 165 is coupled to a through substrate via 50 disposed within the first substrate 10.

A stress barrier structure 153 is disposed within a top layer of the chip 1. The stress barrier structure 153 comprises a metallic network (as described in other embodiments) and comprises copper or aluminum in one embodiment. In one embodiment, the stress barrier structure 153 comprises a cobweb structure. The stress barrier structure 153 is disposed under the bump 165, and may be electrically connected to the active circuitry of the chip 1. However, unlike the prior embodiments, a dummy bump 175 is disposed between the chip 1 and the second substrate 2. The dummy bump 175 (unlike the bump 165) is not coupled to the active circuitry of the chip 1. The dummy bump 175 is used for mechanically coupling the chip 1 and the second substrate 2.

A further stress barrier structure 173 is disposed under the dummy bump 175 to protect the underlying low-k material layers from stress propagated through the dummy bump 175. As in the prior embodiment, the further stress barrier structure 173 is disposed in the same layer as the redistribution metal line layer 152. In various embodiments, the further stress barrier structure 173 is formed in a top insulating layer disposed above the low-k dielectric insulating layers or extreme low-k dielectric insulating layers of the chip 1. In another embodiment, the further stress barrier structure 173 is disposed within the top metal level of the chip 1. In one embodiment, the further stress barrier structure 173 may be formed as an additional metal level, for example, within the passivation layer of the chip 1. In an alternative embodiment, the stress barrier structure 153 and the further stress barrier structure 173 are disposed in different levels.

Referring to FIG. 5b, (as in FIG. 4a) active device regions 11 are disposed on a top surface of the substrate 10 and separated by isolation regions 15. The active device regions 11 are contacted through contacts 22 disposed within a first insulating layer 21. The metallization comprises second, third, fourth, fifth, sixth, seventh, and eighth insulating material layers 31, 41, 51, 61, 71, 81, and 91 comprising first metal line level (M1), first via level (V1), second metal line level (M2), second via level (V2), third metal line level (M3), third via level (V3), and fourth metal line level (M4). The metallization is covered by a thick ninth insulating layer 111 (passivation layer). A through substrate via 50 is disposed within the substrate 10 and coupled to the bump 165 through a redistribution metal line layer 152. The redistribution metal line layer 152 is formed within a tenth insulating layer 151.

A stress barrier structure 153 is disposed under the bump 165 as described with respect to FIG. 5a. A dummy bump 175 is disposed above the chip 1 and is not coupled to active circuitry of the chip 1. A further stress barrier structure 173 is disposed under the dummy bump 175 and coupled to the active circuitry or to an input/output voltage node. The further stress barrier structure 173 comprises metal lines and may be designed to be similar to the stress barrier structure 153 in some embodiments.

FIG. 5c is a top view and illustrates the stress barrier structure 153 and the further stress barrier structure disposed over the chip 1. The bump 165 and the dummy bump 175 are disposed above and illustrated by dashed lines.

FIG. 6, which includes FIGS. 6a-6j, illustrates a semiconductor chip during fabrication, in accordance with an embodiment of the invention.

Figure 6A:
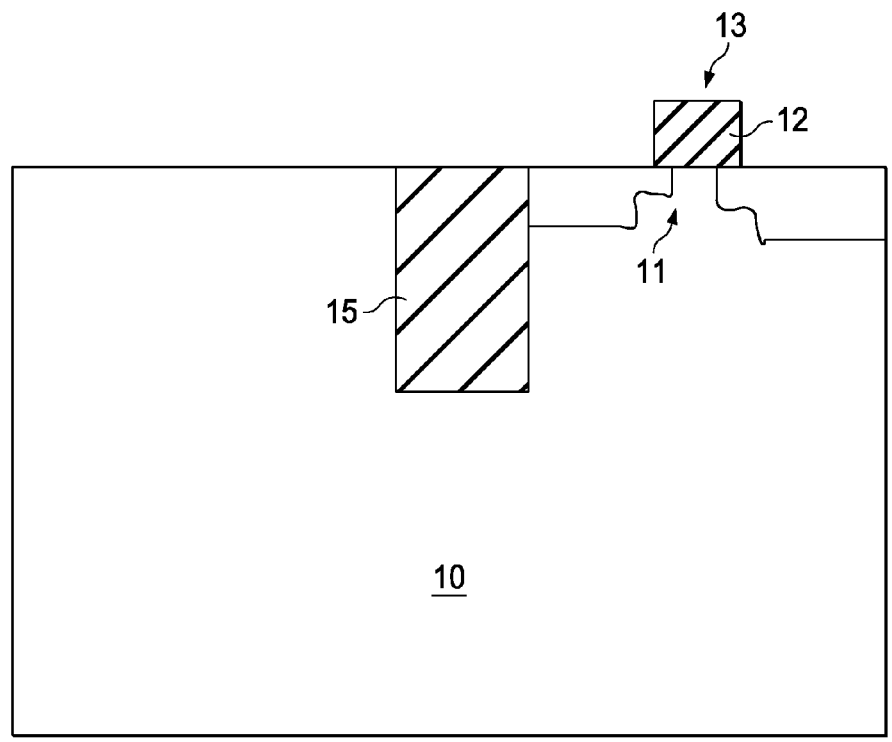
FIGS. 6a-6j, illustrates a semiconductor chip during fabrication, in accordance with an embodiment of the invention.

Referring to FIG. 6a, active device regions 11 are formed on a side near a top surface of a substrate 10 during front end processing. The substrate 10 is typically a semiconductor wafer. The active device regions 11 or active circuitry can include transistors, resistors, capacitors, inductors or other components used to form integrated circuits. For example, active areas that include transistors (e.g., CMOS transistors) can be separated from one another by isolation regions 15, e.g., shallow trench isolation. In an alternative embodiment, the active device regions 11 comprise bipolar transistors.

Referring to FIG. 6a, examples of the substrate 10 include a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer. In other embodiments, other semiconductors, such as silicon germanium, germanium, gallium arsenide, indium arsenide, indium gallium arsenide, indium antimonide or others, can be used with the wafer.

Isolation trenches are formed in the substrate 10. Conventional techniques may be used to form the isolation trenches. For example, a hard mask layer (not shown here), such as silicon nitride, can be formed over the substrate 10 and patterned to expose the isolation areas. The exposed portions of the substrate 10 can then be etched to the appropriate depth, which is typically between about 200 nm and about 400 nm. The isolation trenches are filled with an isolating material thereby forming shallow trench isolation 15. Gate dielectrics are deposited followed by the formation of a gate stack 12. The gate stack 12 comprises a semiconductor material, such as polysilicon, metallic or silicide materials. The source/drain extensions, source/drain, and channel regions are doped with implant and anneal processes to form the transistors 13.

Next, metallization is formed over the active device regions 11 to electrically contact and interconnect the active device regions 11. The metallization and active circuitry together form a completed functional integrated circuit. In other words, the electrical functions of the chip can be performed by the interconnected active circuitry. In logic devices, the metallization may include many layers, e.g., nine or more, of copper. In memory devices, such as DRAMs, the number of metal levels may be less and may be aluminum.

The components formed during the front-end processing are interconnected by back end of line (BEOL) processing. During this process, contacts are made to the semiconductor body and interconnected using metal lines and vias. As discussed above, modern integrated circuits incorporate many layers of vertically stacked metal lines and vias (multilevel metallization) that interconnect the various components in the chip.

Figure 6B:
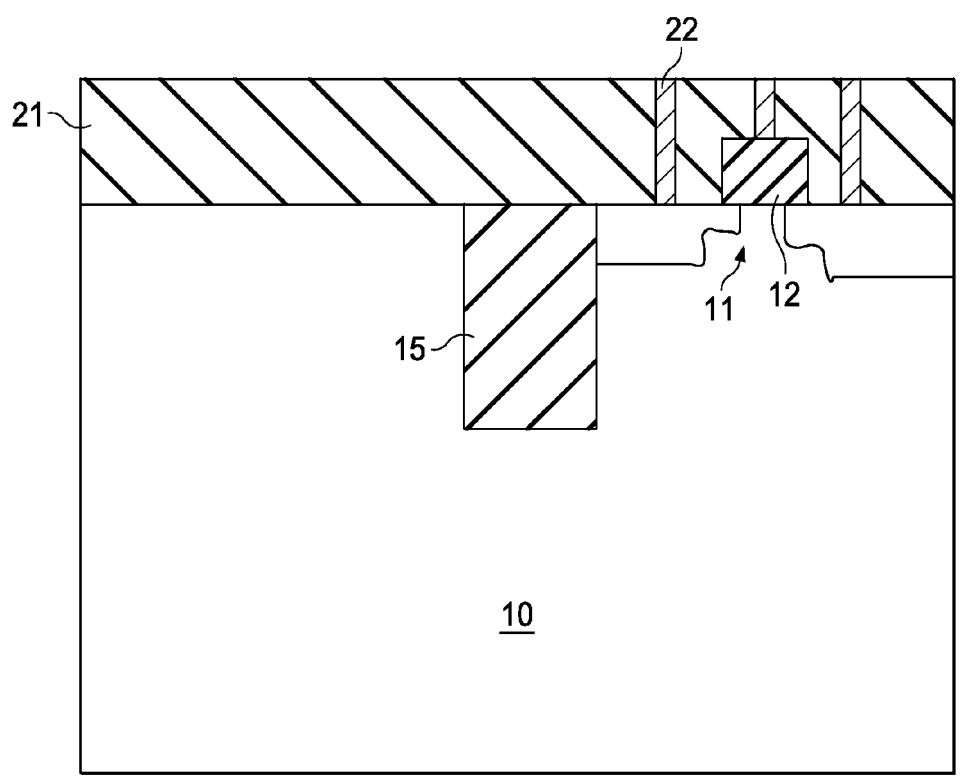

Referring now to FIG. 6b, a first insulating material layer 21 is formed over an etch stop liner. The etch stop liner is deposited over the substrate 10 before depositing the first insulating material layer 21 to also protect the underlying substrate during contact plug formation. For example, a nitride film (e.g., silicon nitride) is deposited as an etch stop liner.

The first insulating material layer 21 comprises insulating materials typically used in semiconductor manufacturing for inter-level dielectric (ILD) layers, such as $SiO_2$, tetra ethyl oxysilane (TEOS), fluorinated TEOS (FTEOS), doped glass (BPSG, PSG, BSG), organo silicate glass (OSG), fluorinated silicate glass (FSG), or spin-on glass (SOG), SiN, SiON.

The first insulating material layer 21 comprises insulating materials such as $SiO_2$, tetra ethyl oxysilane (TEOS), fluorinated TEOS (FTEOS), doped glass (BPSG, PSG, BSG), organo silicate glass (OSG), or fluorinated silicate glass (FSG). The first insulating material layer 21 may comprise a thickness of about 500 nm or less.

In regions with substrate contact plugs, the first insulating material layer 21 and the etch stop liner are patterned and etched. The substrate contact plugs 22 are made of a multi-layer structure comprising a first conductive liner (e.g. CVD titanium nitride and silicon doped tungsten) and a first conductive material (e.g. tungsten).

Figure 6C:
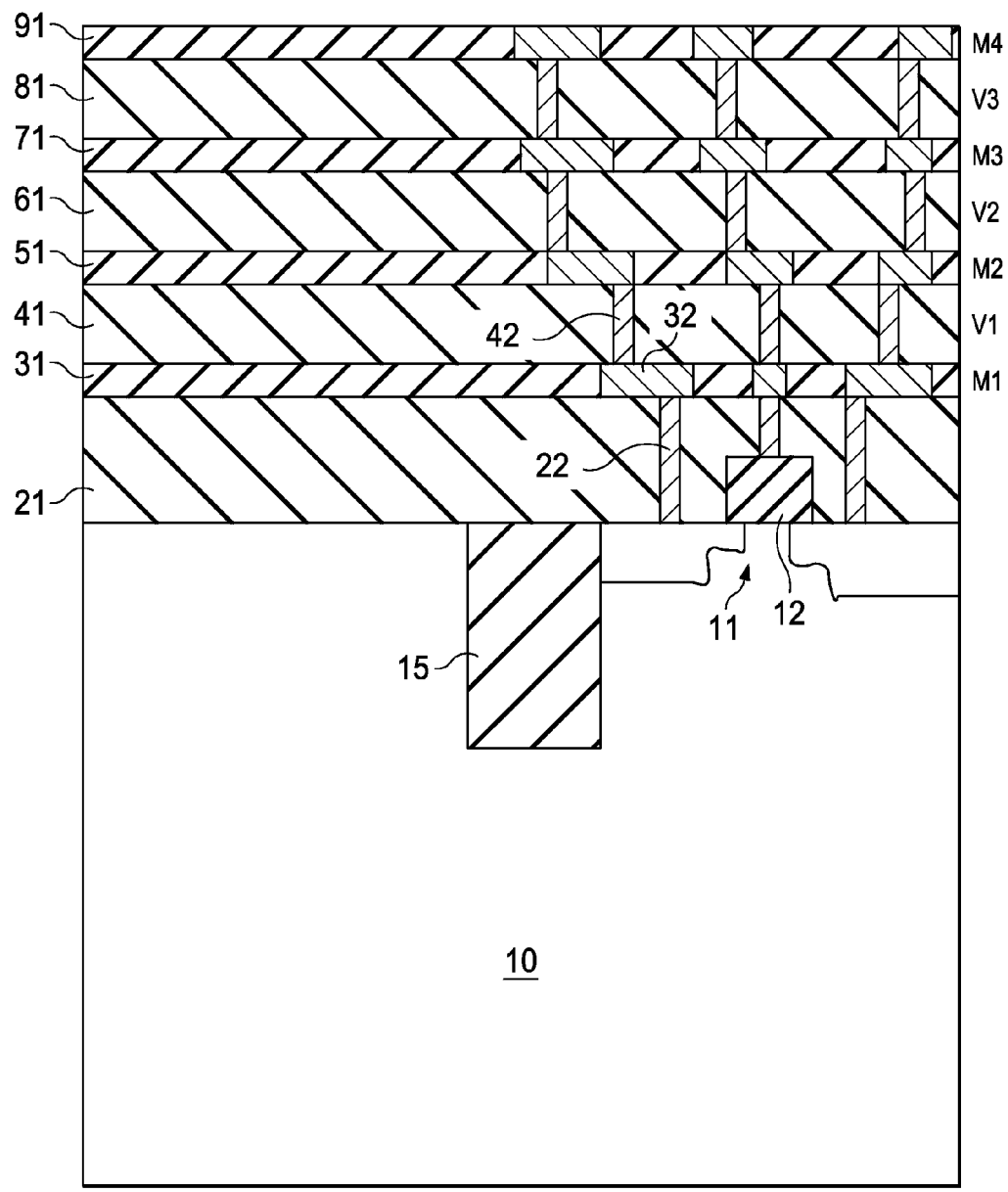

Referring now to FIG. 6c, a second insulating material layer 31 is then deposited over the first insulating material layer 21. The second insulating material layer 31 comprises insulating materials typically used in semiconductor manufacturing for inter-level dielectric (ILD) layers, such as $SiO_2$, tetra ethyl oxysilane (TEOS), fluorinated TEOS (FTEOS), doped glass (BPSG, PSG, BSG), organo silicate glass (OSG), fluorinated silicate glass (FSG), or spin on glass, as well as other suitable low-k and ultra low-k dielectric materials. In one embodiment, the second insulating material layer 31 comprises a low-k dielectric material having a dielectric constant of 3.6 or less, and may require heating, e.g., up to 400 degrees C. to remove solvents. The second insulating material layer 31 is patterned via lithography, e.g., with a mask. A photoresist is deposited over the second insulating material layer 31, and portions of the photoresist are exposed, developed and removed, leaving a pattern for a metal line. The exposed second insulating material layer 31 is removed to form an opening in the second insulating material layer 31.

A second conductive liner is preferably deposited using a conformal deposition process, leaving a conformal liner or diffusion barrier along the interior walls of the opening. In one embodiment, the second conductive liner comprises tantalum nitride deposited by plasma vapor deposition (PVD). Alternatively, the second conductive liner may comprise titanium nitride, tungsten nitride, a refractory metal or other barrier layers that may be conformally deposited, for example, using CVD, PVD processes or electro-less plating. The second conductive liner may comprise a bi-layer of material, including, for example, a barrier layer and a conformal seed layer, which in one embodiment comprises copper, aluminum, other metals or combinations thereof. The seed layer may be deposited using a CVD process, for example.

The remainder of the opening is filled with a second conductive material 32, for example, using an electroplated fill process to form a first metal line level (M1) having a portion residing within the second insulating material layer 31 and a portion residing over the first insulating material layer 21. The second conductive material 32 in one embodiment comprises copper, aluminum or other metals or combinations thereof.

A third insulating material layer 41 is deposited over the second insulating material layer 31. The third insulating material layer 41 is patterned and etched to create via holes. The via holes are filled with a third conductive material 42 such as copper to form first via level (V1). Similarly, more metal line levels and via levels are formed above the first via level (V1).

For example, in FIG. 6c, fourth, fifth, sixth, seventh, and eighth insulating material layers 51, 61, 71, 81, and 91 comprising second metal line level (M2), second via level (V2), third metal line level (M3), third via level (V3), and fourth metal line level (M4) are formed. Further levels of metal lines $M_2$, $M_3$, $M_4$, etc and via levels $V_2$, $V_3$, etc. could proceed as discussed above by repeating the process for formation of metal lines and vias.

Figure 6D:
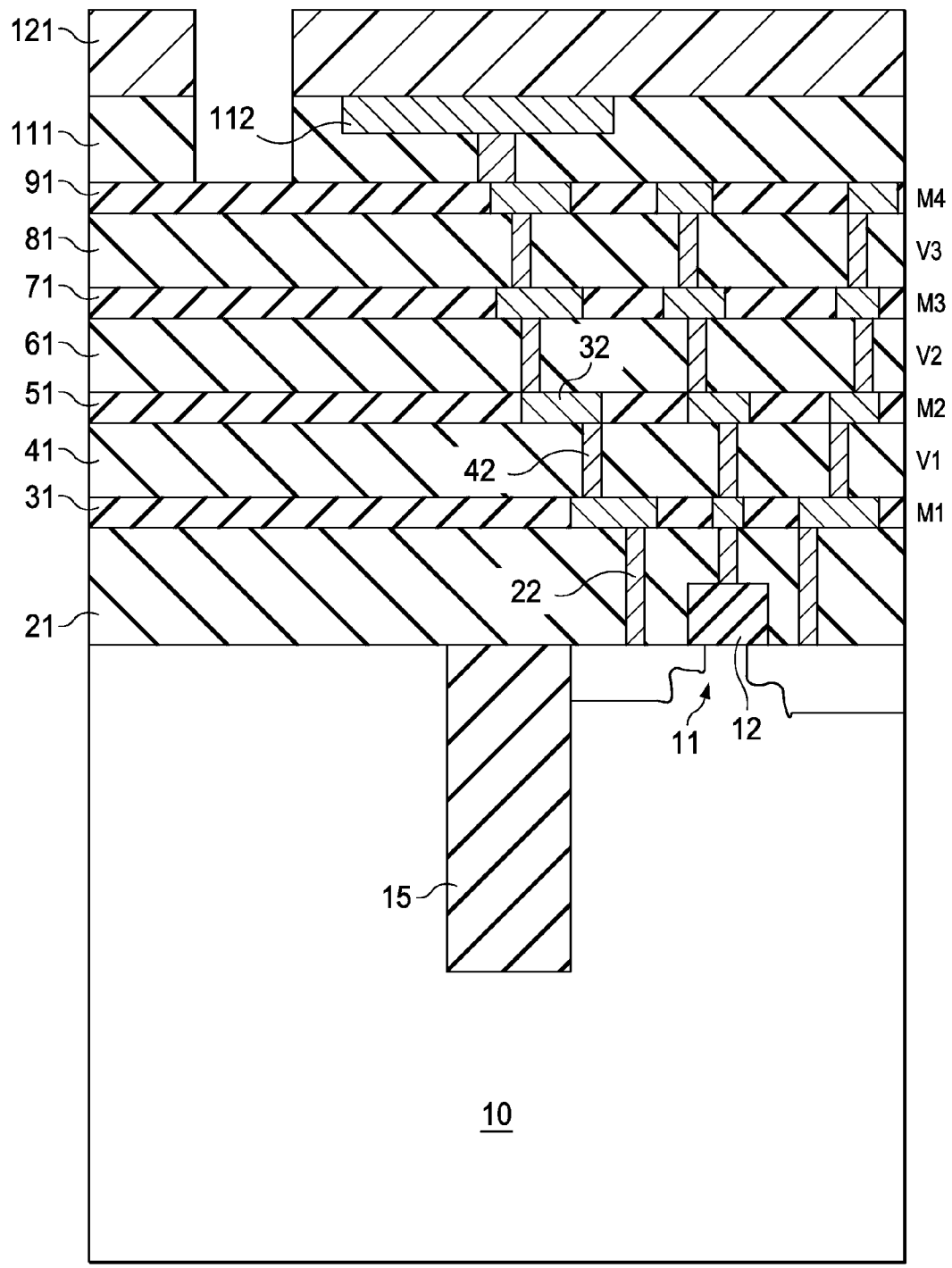

As illustrated in FIG. 6d, a ninth insulating layer 111 is deposited over the fourth metal line level M4. The ninth insulating layer 111 is an insulating layer and typically comprises an oxide layer or an oxide/nitride layer stack. In one embodiment, metal pads 112 are formed within the ninth insulating layer 111 for coupling to redistribution lines for contacting the substrate.

A hard mask layer 121 is formed over the ninth insulating layer 111 (FIG. 6d). In various embodiments, the hard mask layer 121 is coated, for example, by a spin-on process or applied using a chemical vapor deposition process. In various embodiments, the hard mask layer 121 comprises a nitride, organic polymer, BCB, polyimide, photoimide or inorganic dielectric.

In some embodiments, the hard mask layer 121 is also photo sensitive and can be directly exposed using photolithography. Examples of photo-sensitive hard mask layer 121 include photo-sensitive polyimides that can be directly developed. In case of a non-photo-sensitive polyimide, a photo resist is deposited. Using a photolithography process, the hard mask layer 121 and the ninth insulating layer 111 are patterned to form a pattern for forming through substrate vias.

Figure 6E:
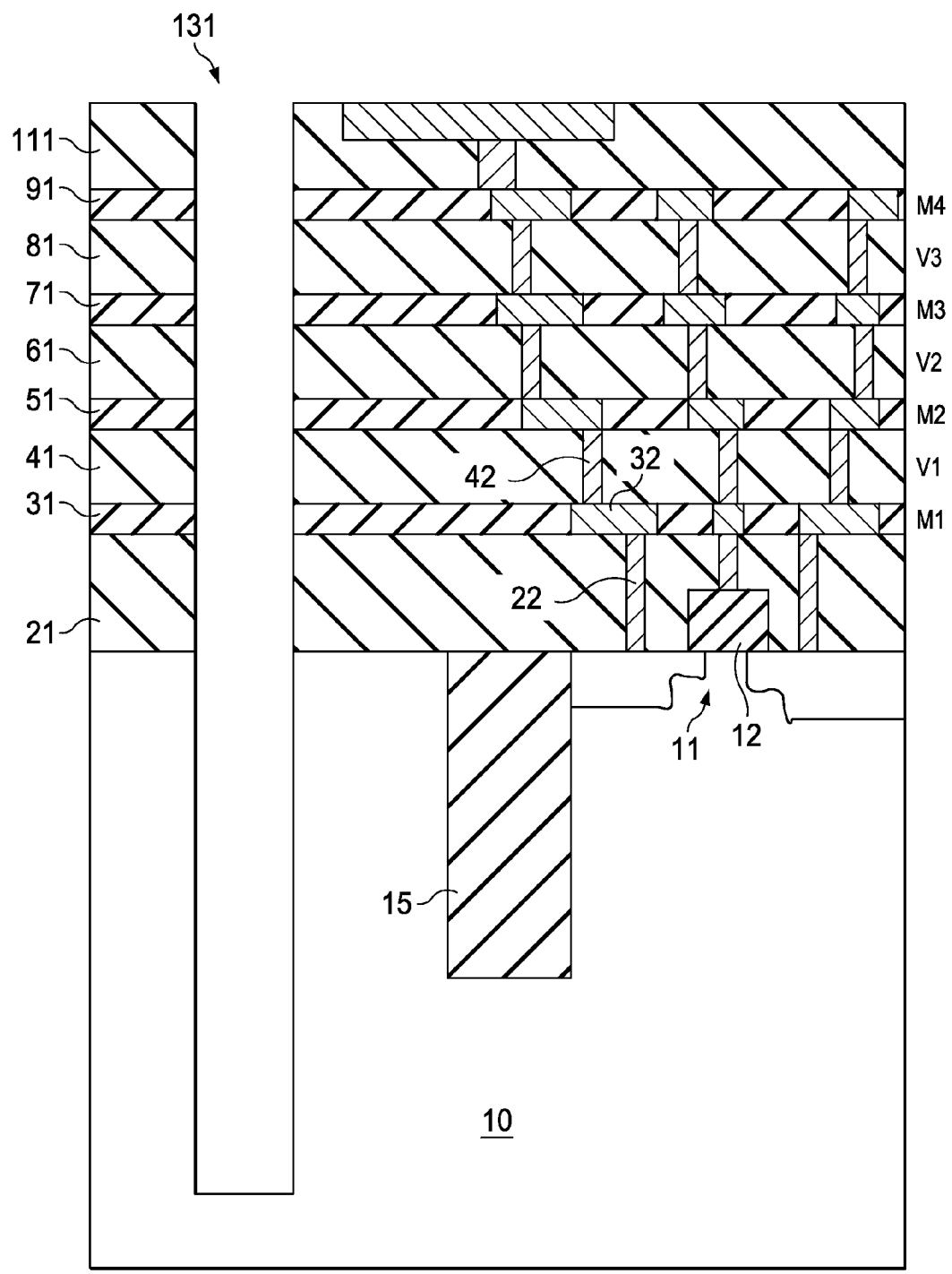

Using the patterned hard mask layer 121, the metallization levels and substrate 10 are etched, as shown in FIG. 6e, to form a through substrate via (TSV) opening 131. In various embodiments, multiple etch chemistries may be used to etch through the various insulating layers (which may comprise different materials).

Referring again to FIG. 6e, a high density plasma process in an RF plasma chamber is used to form the TSV opening 131. In one embodiment, a highly anisotropic etch is used to form a TSV opening 131. In other embodiments, other types of etch processes may be used, including processes using simultaneous bottom etch and sidewall passivation. The top of the TSV opening 131 comprises a width of about 2 μm to about 20 μm. The TSV opening 131 thus produced comprises a high aspect ratio opening in the range from about 1:3 to about 1:30 (ratio of width to depth).

Figure 6F:
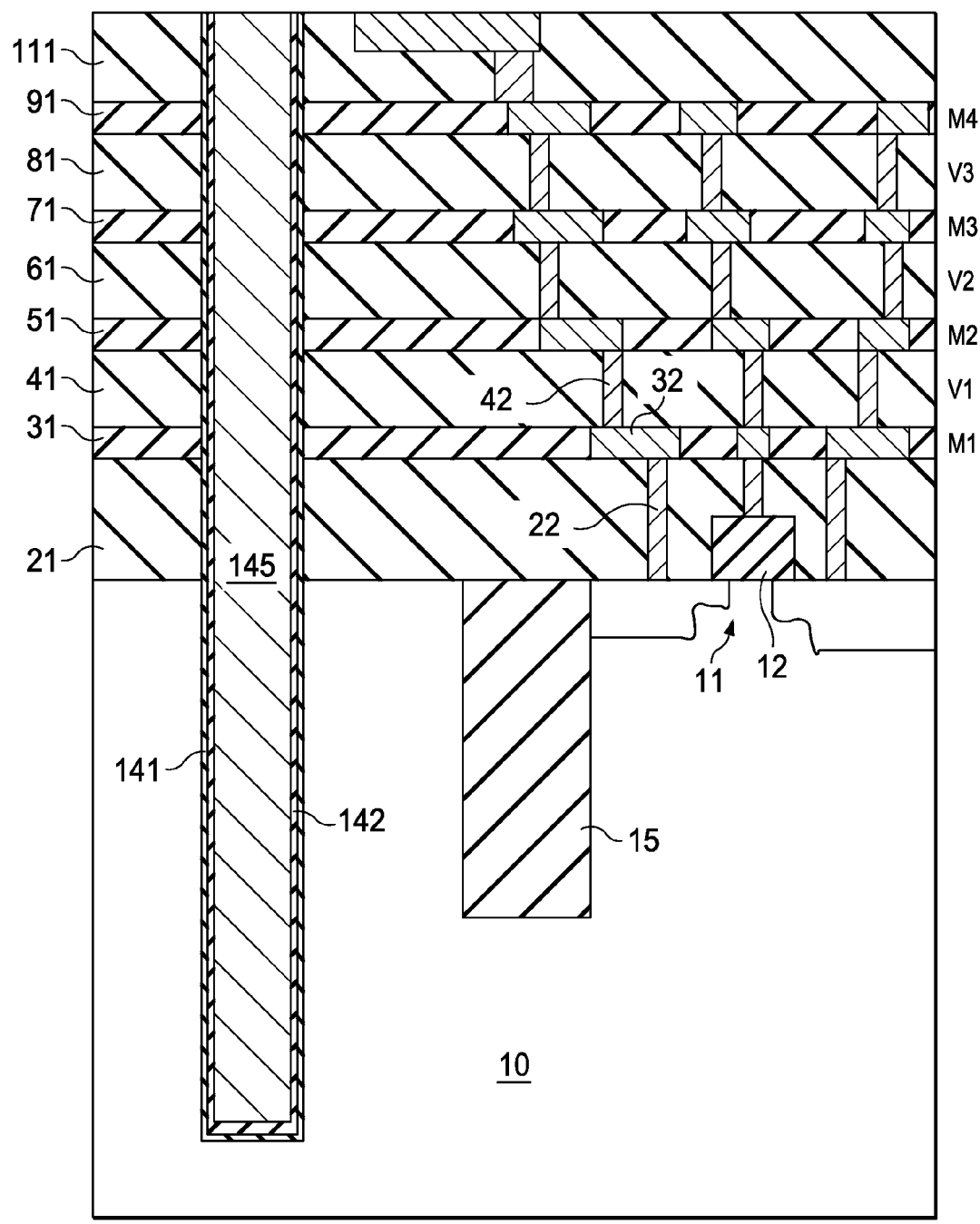

As next illustrated in FIG. 6f, the TSV opening 131 (as in FIG. 6e) is lined with an insulating liner 141, which is formed on the sidewalls of the TSV opening 131. The insulating liner 141 electrically insulates the active device regions 11 from the through substrate via (to be formed). The insulating liner 141 may comprise silicon oxide, silicon nitride, silicon oxynitride, SiC, SiCN, a dense or porous low k or ultra low k dielectric material, an organic material or polymere like parylene, BCB, SiLK or others. In some embodiments, the insulating liner 141 is anisotropically etched forming a sidewall spacer.

A trench liner 142 is deposited on the insulating liner 141 (FIG. 6f). A trench liner 142 comprising one or multiple metal liners is deposited over the insulating liner 141. The trench liner 142 is at least continuously deposited over the insulating liner 141, and ideally conformal. The trench liner 142 may comprise a single layer or multiple layers. In various embodiments, the trench liner 142 comprises Ta, TaN, W, WN, WCN, WSi, Ti, TiN, Ru, Cu, and combinations thereof. The trench liner 142 is used in some embodiments as a barrier layer for preventing metal from diffusing into the underlying substrate 10 and the insulating liner 141.

The trench liner 142 metal liner is formed using a chemical vapor deposition process, a plasma enhanced CVD process, a plasma vapor deposition process, or a combination of both, although in other embodiments other processes may be used. The trench liner 142 comprises a Ti/TiN layer or Ta/TaN layer and a copper seed layer. For example, a 5-30 nm titanium layer is deposited followed by a deposition of about a 10-100 nm TiN layer, and a 50-1000 nm copper seed layer.

As illustrated in FIG. 6f, a conductive fill material 145 is deposited into the TSV opening 131 and planarized. In various embodiments, the conductive fill material 145 is electroplated over the trench liner 142. The conductive fill material 145 comprises a conductive material, such as copper or alternatively, aluminum, tungsten, silver, gold or doped polysilicon. In various embodiments, the conductive fill material 145 comprises copper. A post chemical mechanical polishing (CMP) cleaning is next performed to remove any slurry residuals.

Alternatively, the planarization process comprises a CMP. The CMP process removes the conductive fill material 145 and the underlying trench liner 142 from over the ninth insulating layer 111. In various embodiments, the polishing process stops on the insulating liner 141 and/or ninth insulating layer 111.

Figure 6G:
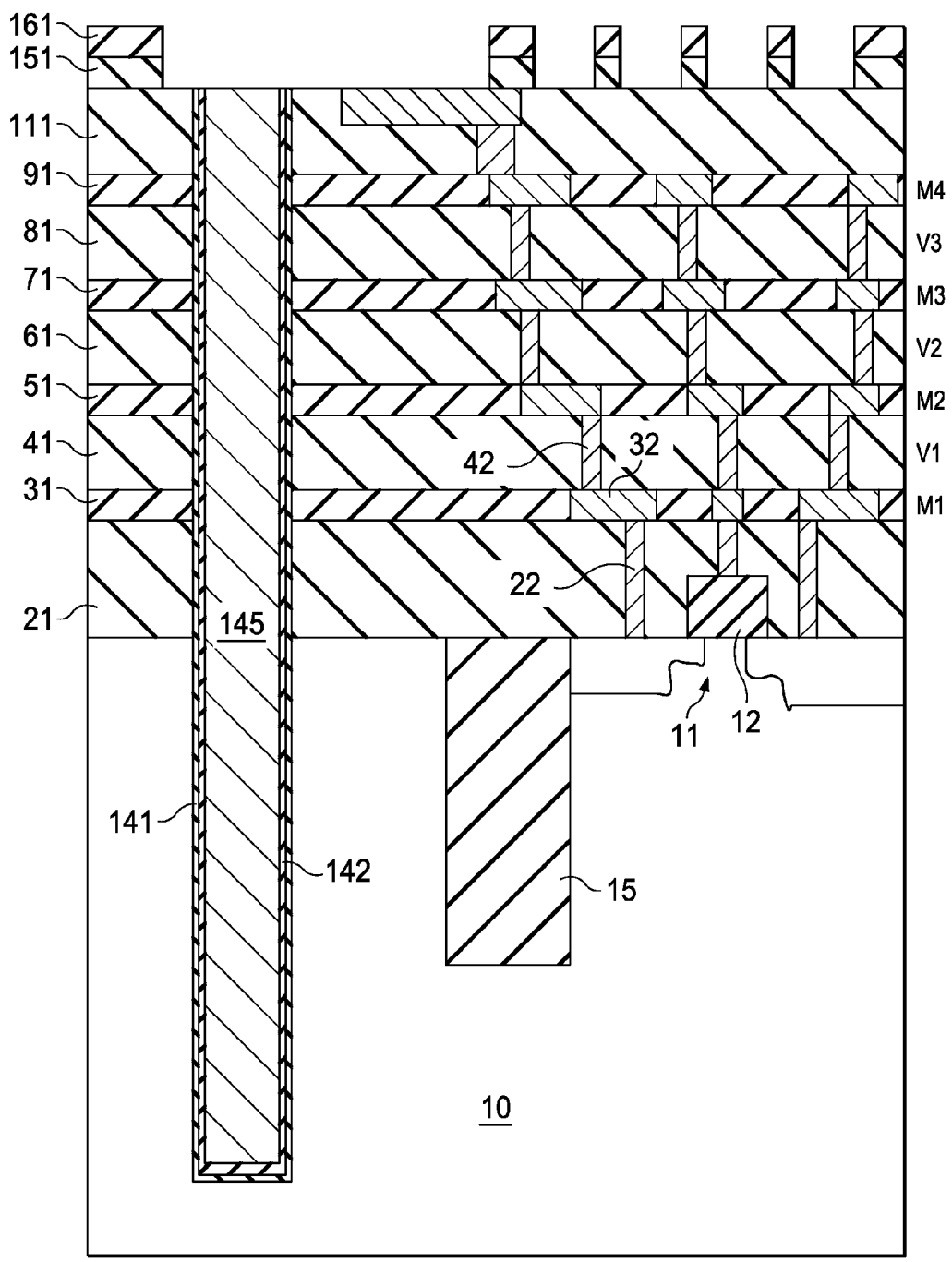

Referring to FIG. 6g, a tenth insulating material layer 151 is deposited over the ninth insulating layer 111. The tenth insulating material layer 151 is an insulating layer and a passivation layer, and typically comprises an oxide layer or an oxide/nitride layer stack. In other embodiments, the tenth insulating material layer 151 may comprise other suitable insulating materials. An optional insulating liner is disposed above the tenth insulating layer 151 in some embodiments. The optional insulating liner comprises a nitride layer, in one embodiment. In an alternative embodiment, the through substrate via is formed after depositing the passivation layer.

A dielectric layer 161 is formed over the tenth insulating material layer 151. In various embodiments, the dielectric layer 161 is coated, for example, by a spin-on process or applied using a chemical vapor deposition process. In various embodiments, the dielectric layer 161 comprises organic polymer, BCB, polyimide, photoimide or inorganic dielectric. In some embodiments, the dielectric layer 161 is also photo sensitive and can be directly exposed using photolithography. Examples of photo-sensitive dielectric layer 161 include photo-sensitive polyimides that can be directly developed. In case of a non-photo-sensitive polyimide, a photo resist is deposited. Using a photolithography process, the dielectric layer 161 and the tenth insulating material layer 151 are patterned to open the metal pads on the last metal level.

Figure 6H:
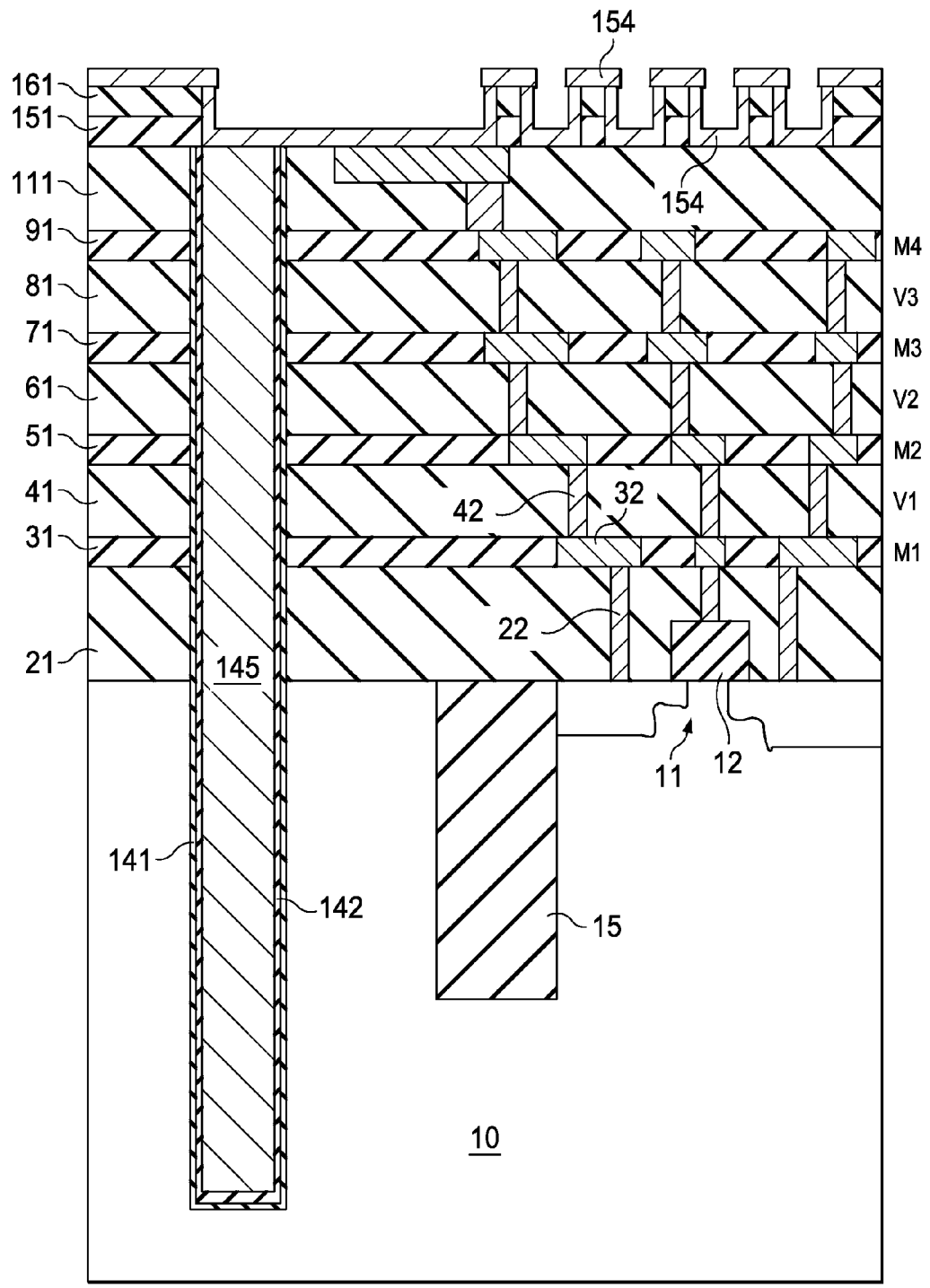

Referring to FIG. 6h, a metal liner 154 is deposited. In various embodiments, the metal liner 154 is deposited using a deposition process to form a conformal layer comprising Ti, Ta, Ru, W, combinations thereof, or a nitride, silicide, or carbide thereof. Examples of such combinations include TiN, TaN, WN, and TiW. In various embodiments, the metal liner 154 is deposited using a chemical vapor deposition, plasma vapor deposition or atomic layer deposition. In various embodiments, the metal liner 154 comprises a thickness of about 20 nm to about 200 nm). The metal liner 154 is a diffusion barrier metal and prevents out-diffusion of copper from the last metal line as well as any intermixing with further metallic layers.

In some embodiments, a seed layer is deposited over the metal liner 154. In various embodiments, the seed layer is deposited using a deposition process to form a conformal layer. In various embodiments, the seed layer is deposited using a chemical vapor deposition, plasma vapor deposition or atomic layer deposition. In various embodiments, the seed layer comprises a thickness of about 20 nm to about 200 nm. The seed layer provides the seed layer for the growth during the electroplating process. In various embodiments, the seed layer comprises copper or other metals like Al, W, Ag, Au, Ni or Pd.

Figure 6I:
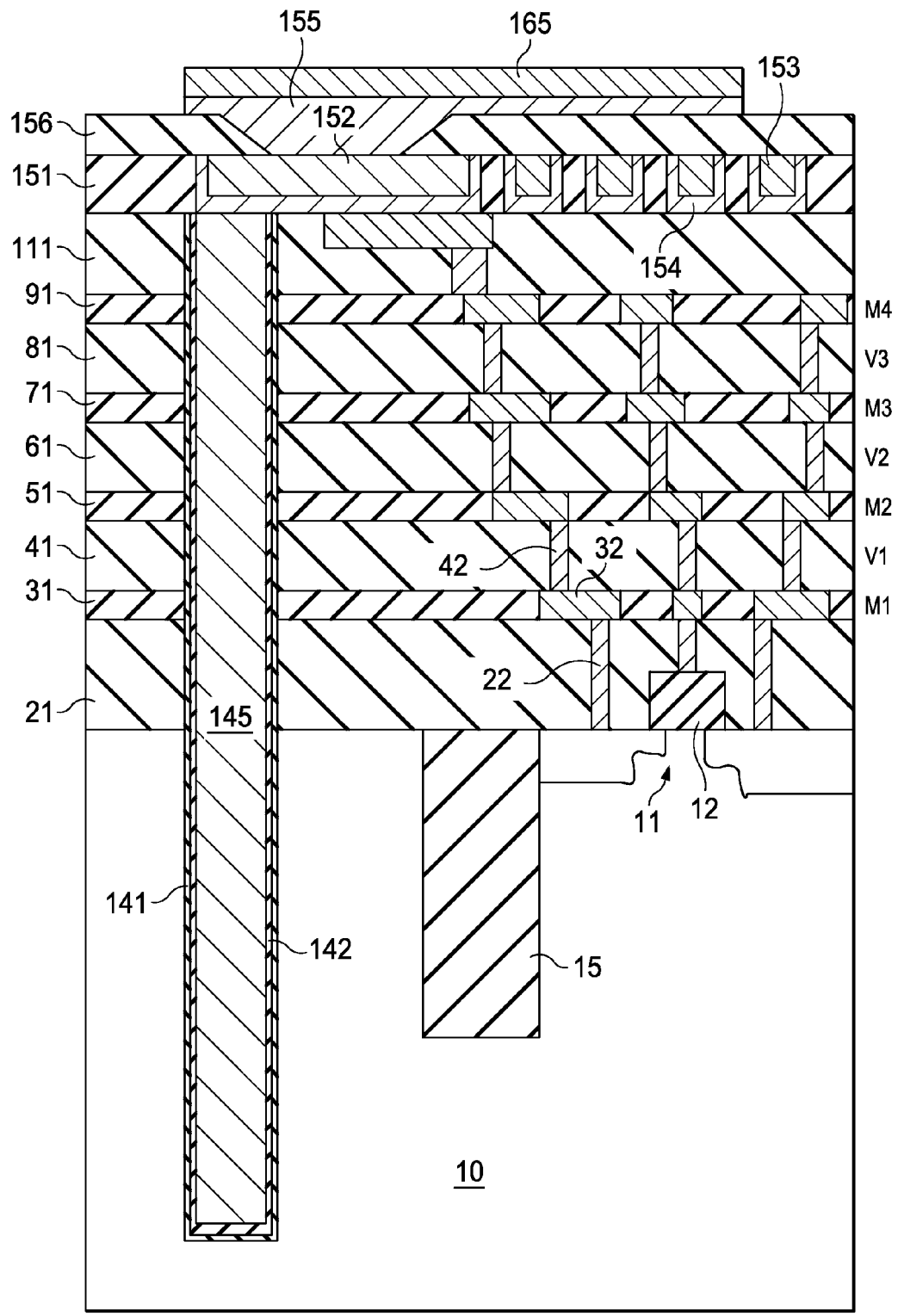

Referring next to FIG. 6i, a redistribution metal line layer 152 is formed. A thick photo resist layer (not shown) is deposited and covers the metal liner 154. In various embodiments, the photo resist layer is several microns thick, and varies from about 1 μm to about 10 μm, in one embodiment. The thick photo resist layer fills the remaining opening (after filling the metal liner 154) formed in the tenth insulating material layer 151 and the dielectric layer 161. The thick photo resist layer is exposed and developed. The patterned thick photo resist layer comprises patterns for redistribution metal lines and pad vias.

Alternately, in various embodiments, the metal liner 154 is directly deposited on the ninth insulating layer 111, and patterned as described above for forming redistribution lines on the ninth insulating layer 111.

The redistribution metal line layer 152 is formed by electroplating a fill metal over the patterned metal liner 154. The redistribution metal line layer 152 comprises a stress barrier structure 153. In various embodiments, the fill metal comprises copper, although in some embodiments, other suitable conductors are used. The seed layer (or metal liner 154) comprises a same material as the material of the subsequent metal lines to enable electroplating, in one embodiment. In various embodiments, the redistribution metal line layer 152 comprises multiple layers, for example, Cu/Ni, Cu/Ni/Pd/Au, Cu/NiMoP/Pd/Au, or Cu/Sn, in one embodiment. The patterned photo resist layer and the metal liner 154 are removed.

Figure 6J:
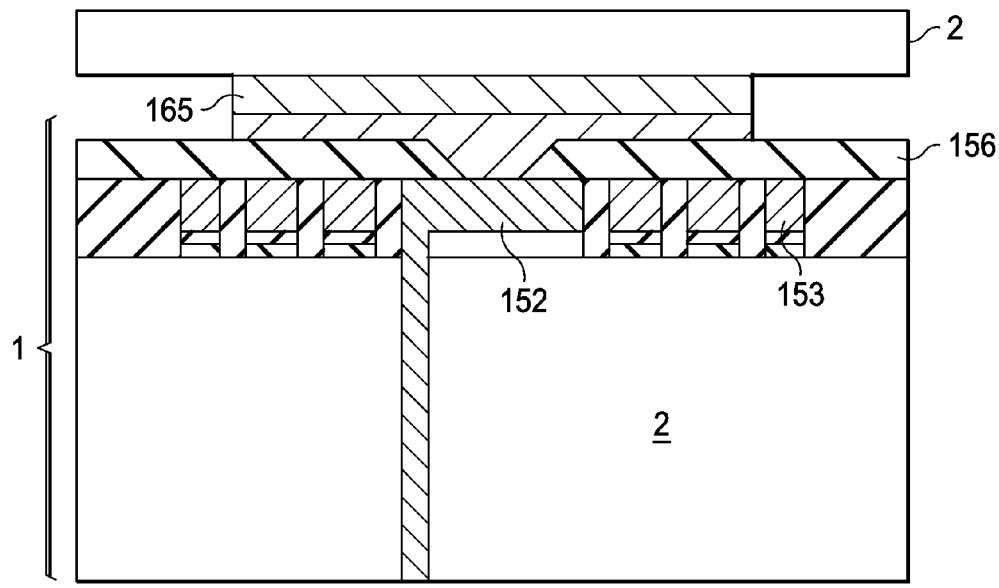

A first polyimide material layer 156, or the like, may then be deposited and patterned forming an under metallization bump (UMB) structure 155. A bump 165 is formed over the UMB structure 155. The bump 165 may comprise copper, Sn—Ag, or a lead free alloy. The substrate 10 is thinned from the back side, for example, by flipping over and grinding, lapping, polishing, and/or etching processes. After required back side processing to expose the through substrate via, the substrate 10 is diced to form a chip 1. The chip 1 is mounted onto a second substrate 2 (for example, a PCB substrate) as illustrated in FIG. 6j.

Figure 7:
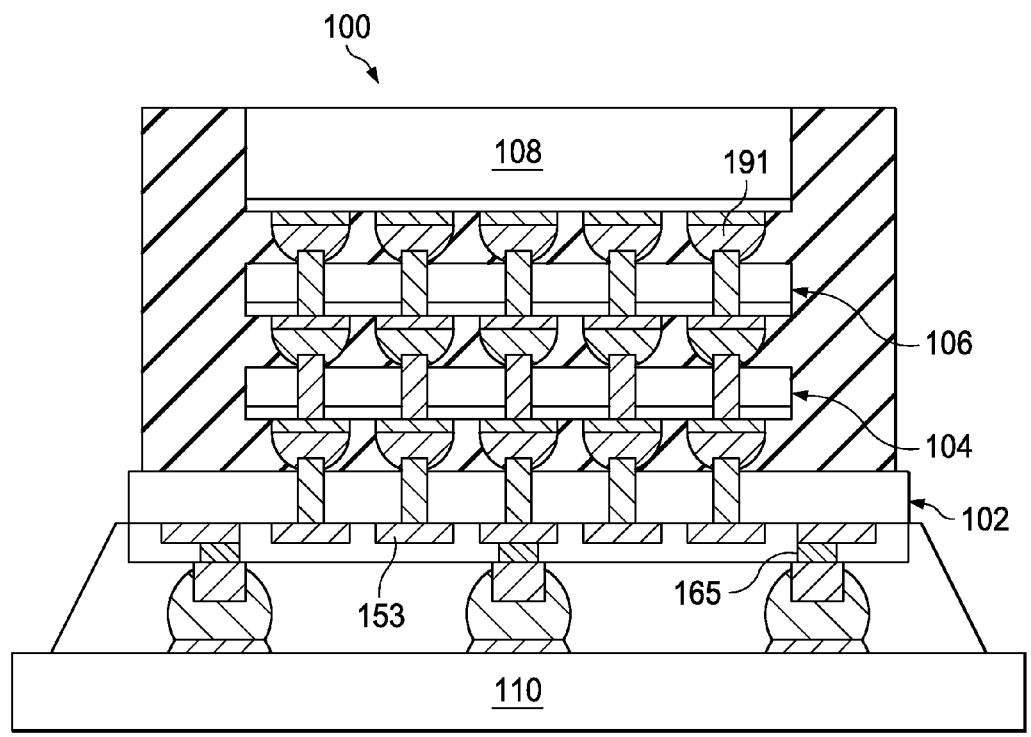
FIG. 7 illustrates a stacked integrated circuit chip in accordance with embodiments of the invention.

FIG. 7 illustrates a stacked integrated circuit formed using embodiments of the invention. Referring to FIG. 7, a stacked integrated chip 100 comprises a first chip 102, a second chip 104, a third chip 106, and a fourth chip 108 disposed on a printed circuit board substrate 110. The first, second, third, and fourth chips 102, 104, 106 and 108 may comprise silicon or other semiconductor materials, for example. Further, substrates, such as the printed circuit board substrate 110, may be comprised of non-semiconductor materials, such as bismaleimide triazine (BT), or the like. The first, second, third, and fourth chips 102, 104, 106, and 108 comprise any suitable type of chips including memory, logic, analog, or combinations thereof.

The first, second, third, and fourth chips 102-108 may include one or more conductive layers. There may be multiple metallization layers formed within chips 102-108, for example, and the first, second, third, and fourth chips 102-108 may include a plurality of other layers such as inter-poly oxide (IPO) or inter-metal dielectric (IMD) layers (not shown). The first, second, third, and fourth chips 102-108 may also include other active components or circuits. Further, the stacked integrated chip 100 may include additional chips therein (also not shown). The chips are coupled together using suitable mechanism, for example, through solder balls 191 in one embodiment. In various embodiments, at least one of the chips, for example, first chip 102 comprises a stress barrier structure 153 (as described in FIGS. 1-5) underneath the corresponding bumps 165.

In various embodiments, a method of fabricating a semiconductor device comprises forming active circuitry disposed in a first substrate, and forming interconnect metallization structure over the active circuitry, wherein the interconnect metallization structure comprises a layer of low-k insulating layer. The method further comprises forming a first stress barrier structure disposed over the layer of low dielectric constant (low-k) insulating layer, and forming a first metal bump disposed over the first stress barrier structure, wherein the first metal bump is coupled to the active circuitry of the first substrate. The method further comprises forming a second stress barrier structure disposed over the low-k insulating layer, and forming a second metal bump disposed over the second stress barrier structure, the second metal bump not coupled to the active circuitry of the semiconductor die.

In an embodiment, the first and the second stress barrier structures are formed in a same insulating layer, and wherein the first and the second stress barrier structures comprise a plurality of interlinked metal lines. In an embodiment, the method further comprises mounting a second substrate to the first metal bump thereby coupling the active circuitry of the first substrate to the second substrate. In an embodiment, the method further comprises forming a through substrate via within the semiconductor die, wherein the first metal bump is electrically coupled to the through substrate via. In an embodiment, the method comprises forming the first stress barrier structure disposed within a passivation layer, and forming the passivation layer disposed above the interconnect metallization structure. In an alternative embodiment, the method comprises forming a redistribution metal line layer, wherein the first stress barrier structure is disposed within a redistribution metal line layer. In an alternative embodiment, the method comprises forming a first stress barrier structure disposed within a top metal level of the interconnect metallization structure, and then forming a passivation layer disposed above the top metal level.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor chip comprising:
   a semiconductor substrate comprising active circuitry and an interconnect metallization structure over the active circuitry, wherein the interconnect metallization structure comprises a layer of low dielectric constant (low-k) insulating layer;
   a first metal bump disposed over the semiconductor substrate and coupled to the active circuitry by way of an under bump metal structure disposed under the first metal bump;
   a first stress barrier structure disposed under the first metal bump, and disposed over the low-k insulating layer, wherein the first stress barrier structure distributes stress across an area larger than the first metal bump, and wherein the first stress barrier structure and the under bump metal structure are physically separate when viewed in a cross-sectional view through at least a portion of the first stress barrier structure;
   a second metal bump disposed over the semiconductor substrate, the second metal bump not coupled to the active circuitry; and
   a second stress barrier structure disposed under the second metal bump, and disposed over the low-k insulating layer.

2. The semiconductor chip of claim 1, wherein the first stress barrier structure comprises a plurality of co-planar, relative to a major surface of the substrate, interlinked metal lines.

3. The semiconductor chip of claim 1, further comprising a through substrate via passing through at least a portion of the semiconductor substrate, wherein the first metal bump is electrically coupled to the through substrate via.

4. The semiconductor chip of claim 1, further comprising a passivation layer overlying the interconnect metallization structure, wherein the first stress barrier structure is disposed within a passivation layer.

5. The semiconductor chip of claim 1, further comprising a redistribution metal line layer overlying the interconnect metallization structure, wherein the first stress barrier structure is co-planar, relative a major surface of the substrate, with the redistribution metal line layer.

6. The semiconductor chip of claim 1, wherein the interconnect metallization structure comprises a plurality of metal line levels, and the first stress barrier structure is disposed within a top metal line level of the interconnect metallization structure.

7. The semiconductor chip of claim 1, further comprising a second insulating layer with a higher dielectric constant than the low-k insulating layer in the interconnect metallization structure, wherein the first stress barrier structure is disposed in the second insulating layer.

8. The semiconductor chip of claim 1, wherein the first and the second stress barrier structures are disposed in a same insulating layer, and wherein the first and the second stress barrier structures comprise a plurality of interlinked metal lines.

9. A structure comprising:
   a semiconductor substrate comprising active circuitry and an interconnect metallization structure over the active circuitry, wherein the interconnect metallization structure comprises a low-k insulating layer;
   a first metal bump disposed over the semiconductor substrate and coupled to the active circuitry;
   a first stress barrier structure disposed under the first metal bump, and disposed over the low-k insulating layer, wherein the first stress barrier structure comprises a plurality of interlinked metal lines, the plurality of interlinked metal lines being co-planar, relative to a major surface of the semiconductor substrate;
   a substrate disposed over and electrically coupled to the first metal bump, wherein the material of the substrate has a coefficient of thermal expansion different from the semiconductor substrate;
   a second metal bump disposed over the semiconductor substrate, the second metal bump not coupled to the active circuitry; and
   a second stress barrier structure disposed under the second metal bump, and disposed over the low-k insulating layer.

10. The structure of claim 9, wherein the substrate comprises a printed circuit board.

11. The structure of claim 9, further comprising a through substrate via passing through at least a portion of the semiconductor substrate, wherein the first metal bump is electrically coupled to the through substrate via.

12. The structure of claim 9, further comprising a passivation layer overlying the interconnect metallization structure, wherein the first stress barrier structure is disposed within the passivation layer.

13. The structure of claim 9, further comprising a redistribution metal line layer overlying the interconnect metallization structure, wherein the first stress barrier structure is disposed within the redistribution metal line layer.

14. The structure of claim 9, further comprising a second insulating layer with a higher dielectric constant than the low-k insulating layer in the interconnect metallization structure, wherein the first stress barrier structure is disposed in the second insulating layer.

15. The structure of claim 9, wherein the first and the second stress barrier structures are disposed in a same insulating layer, and wherein the first and the second stress barrier structures comprise a plurality of interlinked metal lines.

16. A semiconductor chip comprising:
    a semiconductor substrate;
    a plurality of insulating layers overlying the semiconductor substrate, wherein at least one of the plurality of the insulating layers is a low-k insulating layer;
    a plurality of metal line levels formed in the plurality of insulating layers;
    a conductive via passing through the plurality of insulating layers and extending to a portion of the semiconductor substrate;
    a metal bump disposed over the plurality of insulating layers and coupled to the conductive via;
    a second metal bump disposed over the semiconductor substrate, the second metal bump not coupled to the conductive via;
    a stress barrier structure disposed under the metal bump, and disposed over the low-k insulating layer, wherein the stress barrier structure comprises a substantially planar metal layer with a series of openings extending therethrough; and
    a second stress barrier structure disposed under the second metal bump, and disposed over the low-k insulating layer.

17. The semiconductor chip of claim 16, further comprising a redistribution metal line layer overlying the conductive via, wherein the stress barrier structure is disposed within the redistribution metal line layer, and wherein the conductive via comprises copper.

18. The semiconductor chip of claim 17, further comprising an under bump metal structure disposed over the redistribution metal line and under the metal bump.

* * * * *